(12) United States Patent
Cho et al.

(10) Patent No.: US 7,479,419 B2
(45) Date of Patent: Jan. 20, 2009

(54) ARRAY SUBSTRATE FOR LIQUID CRYSTAL DISPLAY DEVICE AND FABRICATING METHOD OF THE SAME

(75) Inventors: Ki-Sul Cho, Gumi-si (KR); Young-Seok Choi, Gumi-si (KR); Byung-Yong Ahn, Daegu (KR); Tae-Ung Hwang, Gyeongsangbuk-do (KR); Dong-Jun Min, Seoul (KR); Bo-Kyoung Jung, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 483 days.

(21) Appl. No.: 11/304,586

(22) Filed: Dec. 16, 2005

(65) Prior Publication Data
US 2006/0262244 A1 Nov. 23, 2006

(30) Foreign Application Priority Data
May 19, 2005 (KR) .................. 10-2005-0041878

(51) Int. Cl.
*H01L 21/84* (2006.01)
(52) U.S. Cl. .................. 438/158; 438/151; 349/84; 349/143
(58) Field of Classification Search .................. 438/158, 438/151; 349/84, 143
See application file for complete search history.

(56) References Cited

U.S. PATENT DOCUMENTS

| 6,716,681 | B2 | 4/2004 | Wen et al. | |
|---|---|---|---|---|
| 7,365,488 | B2 * | 4/2008 | Lee et al. | 313/506 |
| 2004/0036070 | A1 | 2/2004 | Yun | |
| 2004/0262611 | A1 | 12/2004 | Lai | |

FOREIGN PATENT DOCUMENTS

| CN | 1333475 A | 1/2002 |
|---|---|---|
| CN | 1414422 A | 4/2003 |

* cited by examiner

*Primary Examiner*—Zandra Smith
*Assistant Examiner*—Colleen E Rodgers
(74) *Attorney, Agent, or Firm*—McKenna Long & Aldridge LLP

(57) ABSTRACT

A method of manufacturing an array substrate for a liquid crystal display device includes forming a gate line, a gate pad, a gate electrode, and a data pad on a substrate through a first mask process, forming a gate insulating layer on a substantial part of an entire surface of the substrate including the gate line, the gate pad, the gate electrode, and the data pad, forming a data line, a source-drain pattern and an active layer on the gate insulating layer and forming a gate pad contact hole and a data pad contact hole in the gate insulating layer through a second mask process, and forming a pixel electrode, a gate pad terminal, a data pad terminal, a source electrode, a drain electrode, and an ohmic contact layer through a third mask process.

16 Claims, 40 Drawing Sheets

ARRAY SUBSTRATE FOR LIQUID CRYSTAL DISPLAY DEVICE AND FABRICATING METHOD OF THE SAME

This application claims the benefit of Korean Patent Application No. 2005-0041878, filed on May 19, 2005, which is hereby incorporated by reference for all purposes as if fully set forth herein.

BACKGROUND OF THE INVENTION

1. Field of the Invention

The present invention relates to a liquid crystal display device, and more particularly, to an array substrate for a liquid crystal display device and a fabricating method of the same.

2. Discussion of the Related Art

Liquid crystal display (LCD) devices are driven by optical anisotropy and polarization characteristics of a liquid crystal material. Liquid crystal molecules have a definite alignment as a result of their long, thin shapes and are arranged to have initial pretilt angles. The alignment direction can be controlled by applying an electric field. Specifically, variations in an applied electric field influence the alignment of the liquid crystal molecules. Due to optical anisotropy, the refraction of incident light depends on the alignment direction of the liquid crystal molecules. Thus, by properly controlling the applied electric field, an image that has a desired brightness can be produced.

In general, a liquid crystal display (LCD) device includes two substrates, which are spaced apart and face each other. A liquid crystal layer is interposed between the two substrates. Each of the substrates includes an electrode, and the electrodes of each substrate also face each other. Liquid crystal molecules of the liquid crystal layer are driven by an electric field, which is induced between the electrodes and is perpendicular to the substrates. The LCD device has a high transmittance and a large aperture ratio.

Of the different types of known liquid crystal displays (LCDs), active matrix LCDs (AM-LCDs), which have thin film transistors (TFTs) and pixel electrodes arranged in a matrix form, are the subject of significant research and development because of their high resolution and superior ability in displaying moving images.

FIG. 1 is an expanded perspective view schematically illustrating a related art LCD device. As shown in FIG. 1, the LCD device 51 includes a first substrate 5 and a second substrate 10, which are spaced apart from each other, and a liquid crystal layer (not shown) interposed therebetween. A black matrix 6, red, green and blue color filters 7a, 7b and 7c, and a common electrode 9 are formed on a surface of the first substrate 5 facing the second substrate 10. The common electrode 9 is transparent and covers the black matrix 6 and the color filters 7a, 7b and 7c.

A plurality of pixel regions P is defined on a surface of the second substrate 10 facing the first substrate 5. A plurality of gate lines 14 and a plurality of data lines 26 cross each other to define the plurality of pixel regions P. A thin film transistor T is formed at each crossing point of the gate and data lines 14 and 26. A pixel electrode 32 is formed in each pixel region P and is connected to the thin film transistor T. The pixel electrode 32 includes a transparent conductive material having a high transmittance, such as indium-tin-oxide (ITO) or indium-zinc-oxide (IZO).

The first substrate 5 including the black matrix 6, the color filters 7a, 7b and 7c and the common electrode 9 may be referred to as a color filter substrate. The second substrate 10 including the gate lines 14, the data lines 26, the thin film transistors T and the pixel electrodes 32 may be referred to as an array substrate.

The array substrate is manufactured by a photolithographic process using a mask. The photolithographic process may be referred to as a mask process. The array substrate may be commonly manufactured by five or six mask processes.

The array substrate may be manufactured through the following five mask processes: a first mask process forming a gate electrode, a gate line and a gate pad; a second mask process forming an active layer and an ohmic contact layer on a gate insulating layer that covers the gate electrode, the gate line and the gate pad; a third mask process forming a data line, a data pad, and source and drain electrodes on the ohmic contact layer; a fourth mask process forming a passivation layer having a contact hole that exposes the drain electrode; and a fifth mask process forming a pixel electrode contacting the drain electrode through the contact hole.

However, because each of the mask processes includes several steps of cleaning, coating a photoresist layer, exposing through a mask, developing the photoresist layer, and etching, all the mask processes are very complicated and expensive. Therefore, reducing fabricating time and costs by simplifying the processes is an important issue to be resolved.

Accordingly, reducing the number of mask processes has been researched.

FIG. 2 is a plan view of an array substrate fabricated through four-mask processes according to the related art. For convenience of explanation, one pixel region is shown.

As shown in FIG. 2, gate lines 62 are formed along a first direction on a substrate 60, and data lines 82 are formed along a second direction on the substrate 60. The data lines 82 cross the gate lines 62 to thereby define pixel regions P. A gate pad 64 is formed at one end of each gate line 62, and a transparent gate pad terminal 112 contacts and covers the gate pad 64. A data pad 84 is formed at one end of each data line 82, and a transparent data pad terminal 114 contacts and covers the data pad 84.

A thin film transistor T is formed at each crossing point of the gate and data lines 62 and 82. The thin film transistor T includes a gate electrode 64, a first semiconductor layer 90a, a source electrode 94 and a drain electrode 96. The gate electrode 64 is connected to the gate line 62, and the first semiconductor layer 90a overlaps the gate electrode 64. The source and drain electrodes 94 and 96 are spaced apart from each other over the first semiconductor layer 90a.

A transparent pixel electrode 110 is formed in each pixel region P. The pixel electrode 110 contacts the drain electrode 96.

A metal pattern 86 with an island shape is formed over a part of the gate line 62. The metal pattern 86 may be formed of the same material and in the same layer as the source and drain electrodes 94 and 96. The metal pattern 86 contacts the pixel electrode 110.

The gate line 62 and the metal pattern 86 constitute a storage capacitor Cst. The gate line 62 functions as a first electrode of the storage capacitor Cst, and the metal pattern 86 functions as a second electrode of the storage capacitor Cst.

A second semiconductor layer 90b is formed under the metal pattern 86, and a third semiconductor layer 90c is formed under the source and drain electrodes 94 and 96 and the data line 82 due to features of four-mask processes. Each semiconductor layer includes an intrinsic amorphous silicon layer and an impurity-doped amorphous silicon layer. The intrinsic amorphous silicon layer is exposed by the source and drain electrodes 94 and 96, the data line 82 and the data pad 84.

A manufacturing method of an array substrate for an LCD device using four mask processes according to the related art will be explained hereinafter with reference to attached drawings.

FIG. 3A through FIG. 9C illustrate a manufacturing method of an array substrate for an LCD device according to the related art.

FIGS. 3A, 3B and 3C illustrate a first mask process and correspond to cross-sections along the lines IIIA-IIIA, IIIB-IIIB and IIIC-IIIC of FIG. 2, respectively.

As shown in FIGS. 3A, 3B and 3C, a pixel region P, which includes a switching region S, a storage region C, a gate region G, and a data region D are defined on a substrate 60. The storage region C is defined as a part of the gate region G.

A gate line 62 and a gate electrode 64 are formed on the substrate 60 by sequentially depositing and then patterning a metallic material through a first mask process. The gate electrode 64 is connected to the gate line 62 and is disposed in the switching region S. The gate line 62 is disposed in the gate region G and includes a gate pad 66 at one end thereof. The gate line 62 and the gate electrode 64 may have a single-layered structure of aluminum (Al), an aluminum alloy such as AlNd, tungsten (W), chromium (Cr), or molybdenum (Mo) or may have a double-layered structure of Al/Cr or Al/Mo.

FIG. 4A through FIG. 7C illustrate a second mask process. FIGS. 4A, 5A, 6A and 7A correspond to cross-sections along the line IIIA-IIIA of FIG. 2. FIGS. 4B, 5B, 6B and 7B correspond to cross-sections along the line IIIB-IIIB of FIG. 2. FIGS. 4C, 5C, 6C and 7C correspond to cross-sections along the line IIIC-IIIC of FIG. 2.

As shown in FIGS. 4A, 4B and 4C, a gate insulating layer 68, an intrinsic amorphous silicon layer (a-Si:H) 70, an impurity doped amorphous silicon layer (n+ or p+ a-Si:H) 72, and a metal layer 74 are sequentially formed on a substantial part of the entire surface of the substrate 60. The substrate 60 includes the gate electrode 64 and the gate line 62, which includes a gate pad 66 at one end thereof.

The gate insulating layer 68 is formed by depositing a material selected from an inorganic insulating material group including silicon nitride ($SiN_X$) and silicon oxide ($SiO_2$) or an organic insulating material group including benzocyclobutene (BCB) and acrylic resin. The metal layer 74 is formed by depositing one or more materials selected from a metallic material group including aluminum (Al), an aluminum alloy such as AlNd, tungsten (W), chromium (Cr), molybdenum (Mo), a double-layered structure of Al/Cr and a double-layered structure of Al/Mo.

A photoresist layer 76 is formed on the metal layer 74 by coating. A mask M, which includes a transmitting portion B1, a blocking portion B2 and a half transmitting portion B3, is disposed over the photoresist layer 76. The blocking portion B2 corresponds to a part of the switching region S, the data region D, and the storage region C. The half transmitting portion B3 corresponds to the other part of the switching region S, i.e., a center part of the switching region S. The transmitting portion B1 corresponds to the other regions excluding the switching region S, the storage region C and the data region D.

Then, the photoresist layer 76 is exposed to light through the mask M and then is developed.

As shown in FIGS. 5A, 5B and 5C, a first photoresist pattern 78a, a second photoresist pattern 78b and a third photoresist pattern 78c are formed in the switching region S, the data region D and the storage region C, respectively. The first photoresist pattern 78a includes a first part of a first thickness and a second part of a second thickness. The second part corresponds to the center part of the switching region S, and the second thickness is thinner than the first thickness. The second photoresist pattern 78b extends from the first photoresist pattern 78a. The second photoresist pattern 78b and the third photoresist pattern 78c have the first thickness. The metal layer 74 is exposed in the other regions except for the switching region S, the data region D and the storage region C.

Then, the exposed metal layer 74, the impurity-doped amorphous silicon layer 72 and the intrinsic amorphous silicon layer 70 are partially removed. The metal layer 74 may be partially removed simultaneously with the partial removal of the impurity-doped amorphous silicon layer 72 and the intrinsic amorphous silicon layer 70 depending on a material of the metal layer 74. Alternatively, after the metal layer 74 is etched, the impurity-doped amorphous silicon layer 72 and the intrinsic amorphous silicon layer 70 may be dry-etched.

Accordingly, as shown in FIGS. 6A, 6B and 6C, a source-drain pattern 80 is formed under the first photoresist pattern 78a, a data line 82 including a data pad 84 at one end thereof is formed in the data region D, and a metal pattern 86 with an island shape is formed in the storage region C. The data line 82 is connected to the source-drain pattern 80.

A first semiconductor pattern 90a is formed under the source-drain pattern 80, a second semiconductor pattern 90b is formed under the data line 82 including the data pad 84, and a third semiconductor pattern 90c is formed under the metal pattern 86. Each of the first, second and third semiconductor patterns 90a, 90b and 90c includes the patterned intrinsic amorphous silicon layer 70 and the patterned impurity-doped amorphous silicon layer 72.

Then, the second part of the first photoresist pattern 78a is removed through an ashing process to thereby expose a part of the source-drain pattern 80. The first part of the first photoresist pattern 78a, the second photoresist pattern 78b and the third photoresist pattern 78c are partially removed. Thus the thicknesses of the first part of the first photoresist pattern 78a, the second photoresist pattern 78b and the third photoresist pattern 78c are reduced, and edges of the source-drain pattern 80, the data line 82, the data pad 84 and the metal pattern 86 are exposed.

As shown in FIGS. 7A, 7B and 7C, the exposed the source-drain pattern 80 and the impurity-doped amorphous silicon layer 72 thereunder are removed after the ashing process to thereby expose the intrinsic amorphous silicon layer 92a of the first semiconductor layer 90a. Therefore, source and drain electrodes 94 and 96 and an ohmic contact layer 92b are formed. The intrinsic amorphous silicon layer 92a of the first semiconductor layer 90a functions as an active layer.

The metal pattern 86 and the gate line 62 in the storage region C constitute a storage capacitor Cst with the gate insulating layer 68 therebetween. The gate line 62 functions as a first electrode of the storage capacitor Cst, and the metal pattern 86 functions as a second electrode of the storage capacitor Cst. The third semiconductor pattern 90c is interposed between the gate line 62 and the metal pattern 86.

Then, the first, second and third photoresist patterns 78a, 78b and 78c are removed. Thus, the second mask process is completed.

FIGS. 8A, 8B and 8C illustrate a third mask process and correspond to cross-sections along the line IIIA-IIIA, IIIB-IIIB and IIIC-IIIC of FIG. 2, respectively.

As shown in FIGS. 8A, 8B and 8C, a passivation layer 100 is formed on an entire surface of the substrate 60 including the source and drain electrodes 94 and 96, the data line 82 including the data pad 84, and the storage capacitor Cst thereon by depositing a material selected from an inorganic insulating material group including silicon nitride ($SiN_x$) and silicon oxide ($SiO_2$) or an organic insulating material group including benzocyclobutene (BCB) and acrylic resin.

The passivation layer 100 is patterned to thereby form a drain contact hole 102, a storage contact hole 104, a gate pad contact hole 106, and a data pad contact hole 108. The drain contact hole 102, the storage contact hole 104, the gate pad contact hole 106 and the data pad contact hole 108 expose the drain electrode 96, the metal pattern 86, the gate pad 66 and the data pad 84, respectively.

FIGS. 9A, 9B and 9C illustrate a fourth mask process and correspond to cross-sections along the line IIIA-IIIA, IIIB-IIIB and IIIC-IIIC of FIG. 2, respectively.

As shown in FIGS. 9A, 9B and 9C, a pixel electrode 110 is formed on an entire surface of the substrate 60 including passivation layer 100 thereon by sequentially depositing and then patterning a material selected from a transparent conductive group including indium tin oxide (ITO) and indium zinc oxide (IZO). Simultaneously, a gate pad terminal 112 and a data pad terminal 114 are formed. The pixel electrode 110 is disposed in the pixel region P, and the pixel electrode 110 contacts the drain electrode 96 through the drain contact hole 102 and the metal pattern 86 through the storage contact hole 104. The gate pad terminal 112 contacts the gate pad 66 through the gate pad contact hole 106. The data pad terminal 114 contacts the data pad 84 through the data pad contact hole 108.

An array substrate for the liquid crystal display device of the related art may be fabricated through the four mask processes as disclosed above. Fabricating processes and costs are may be reduced compared to five or six mask processes, and problems may decrease due to the shortened processes.

However, there exists a need to reduce fabricating time and costs by further simplifying the processes.

SUMMARY OF THE INVENTION

Accordingly, the present invention is directed to an array substrate for a liquid crystal display (LCD) device and a fabricating method of the same that substantially obviates one or more of the problems due to limitations and disadvantages of the related art.

An advantage of the present invention is to provide a liquid crystal display device and a fabricating method of the same that reduce manufacturing time and costs and simplify mask processes.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a fabricating method of an array substrate for a liquid crystal display device includes forming a gate line, a gate pad, a gate electrode, and a data pad on a substrate through a first mask process, forming a gate insulating layer on a substantial part of an entire surface of the substrate including the gate line, the gate pad, the gate electrode, and the data pad, forming a data line, a source-drain pattern and an active layer on the gate insulating layer and forming a gate pad contact hole and a data pad contact hole in the gate insulating layer through a second mask process, and forming a pixel electrode, a gate pad terminal, a data pad terminal, a source electrode, a drain electrode, and an ohmic contact layer through a third mask process.

In another aspect of the present invention, the second mask process includes sequentially forming an intrinsic amorphous silicon layer, an impurity-doped amorphous silicon layer and a metal layer on the gate insulating layer, forming a photoresist layer on the metal layer, disposing a mask over the photoresist layer, wherein the mask includes a blocking portion, a transmitting portion, and a half transmitting portion, forming a first photoresist pattern by exposing the photoresist layer to light through the mask and then developing the photoresist layer, the first photoresist pattern selectively exposing the metal layer and having a first part and a second part thinner than the first part, wherein either the transmitting portion or the blocking portion of the mask corresponds to the first part and the half transmitting portion corresponds to the second part, selectively removing the metal layer, the impurity-doped amorphous silicon layer, the intrinsic amorphous silicon layer and the gate insulating layer using the first and second parts of the first photoresist pattern as an etching mask to thereby form the gate pad contact hole and the data pad contact hole, removing the second part of the first photoresist pattern, selectively removing the metal layer, the impurity-doped amorphous silicon layer and the intrinsic amorphous silicon layer using the first part of the first photoresist pattern as an etching mask to thereby form the data line, the source-drain pattern, an impurity-doped amorphous silicon pattern, and the active layer, and removing the first part of the first photoresist pattern.

In another aspect of the present invention, the third mask process includes forming a transparent conductive layer on a substantial part of an entire surface of the substrate including the data line and the source-drain pattern, forming a second photoresist pattern on the transparent conductive layer, selectively removing the transparent conductive layer using the second photoresist pattern as an etching mask to thereby form the pixel electrode, the gate pad terminal and the data pad terminal, selectively removing the source-drain pattern and the impurity-doped amorphous silicon pattern to thereby form the source electrode, the drain electrode and the ohmic contact layer, and removing the second photoresist pattern.

In another aspect of the present invention, an array substrate for a liquid crystal display device includes a substrate, a gate line, a gate pad, a gate electrode, and a data pad on the substrate, a gate insulating layer covering the gate line, the gate pad, the gate electrode, and the data pad, an active layer on the gate insulating layer over the gate electrode, an ohmic contact layer on the active layer, a source electrode, a drain electrode and a data line on the ohmic contact layer, the data line crossing the gate line to define a pixel region, and a pixel electrode in the pixel region, a gate pad terminal contacting the gate pad, and a data pad terminal contacting the data pad and the data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
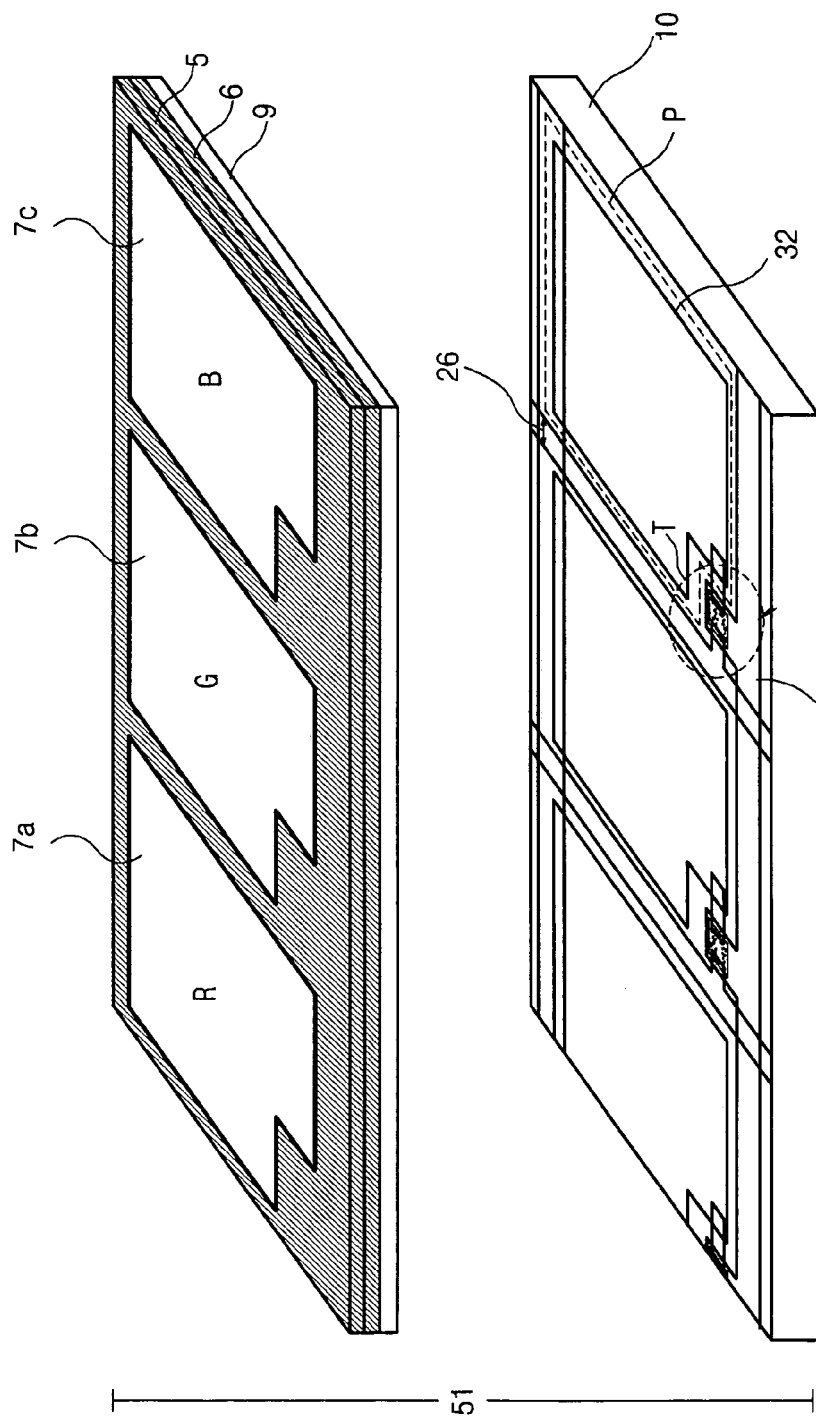
FIG. 1 is an expanded perspective view schematically illustrating a related art LCD device.
Figure 2:
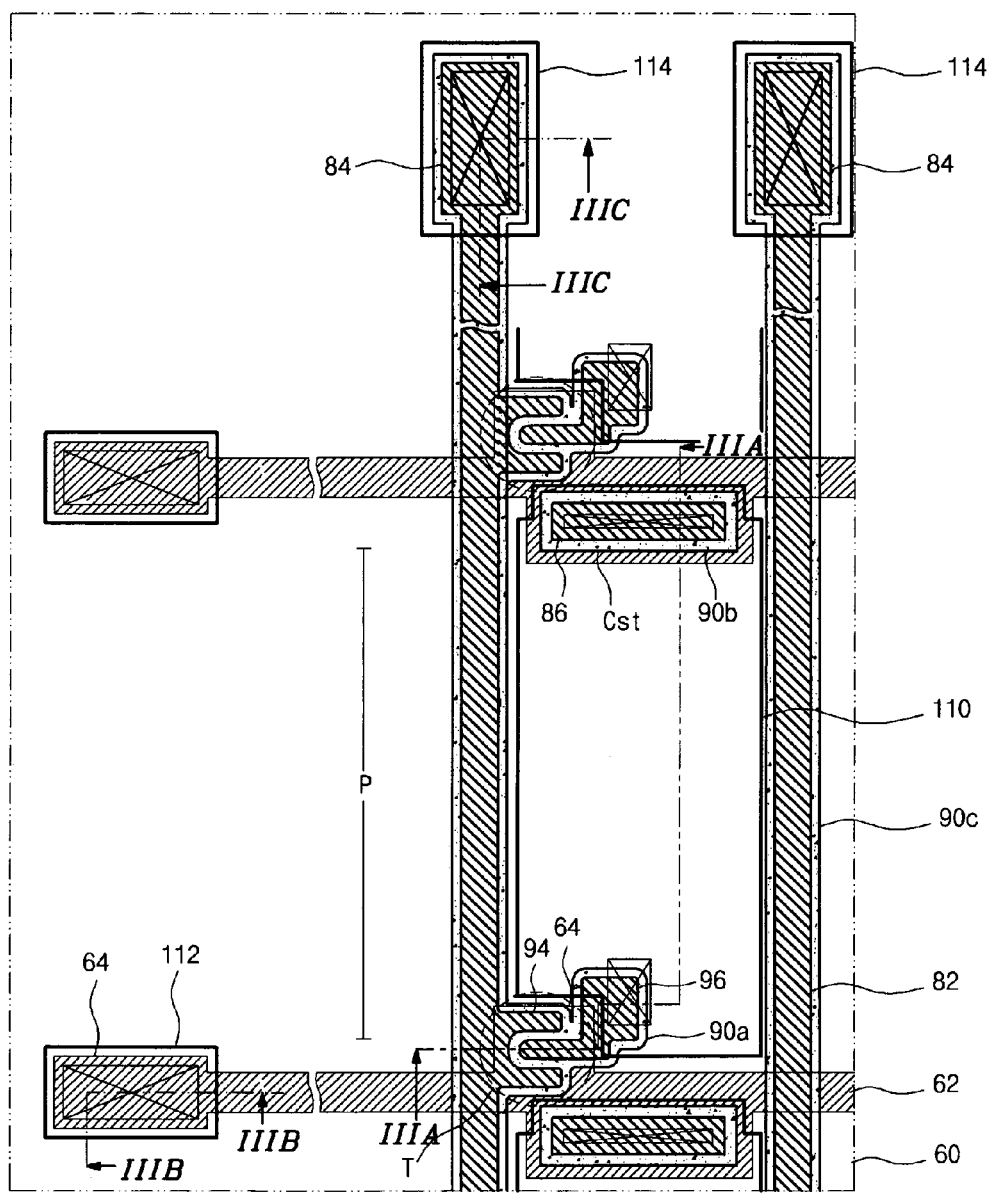
FIG. 2 is a plan view of an array substrate fabricated through four-mask processes according to the related art.
Figure 3A:
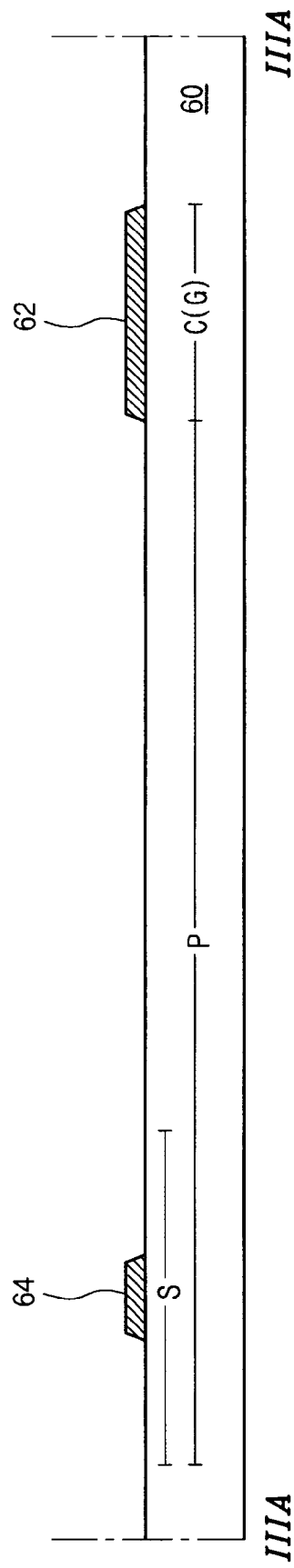
FIGS. 3A to 3C illustrate a first mask process of a fabricating method of an array substrate for an LCD device according to the related art.
Figure 3B:
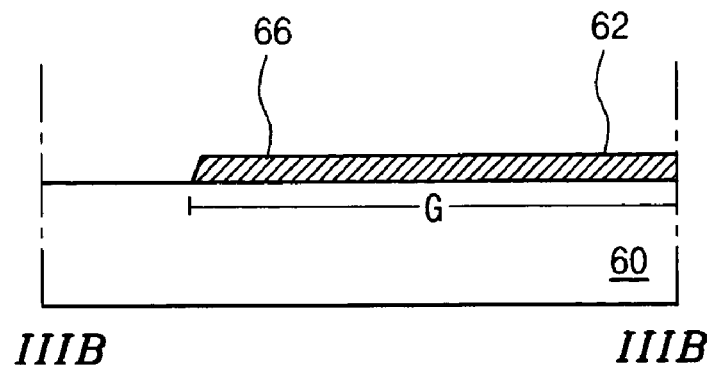
Figure 3C:
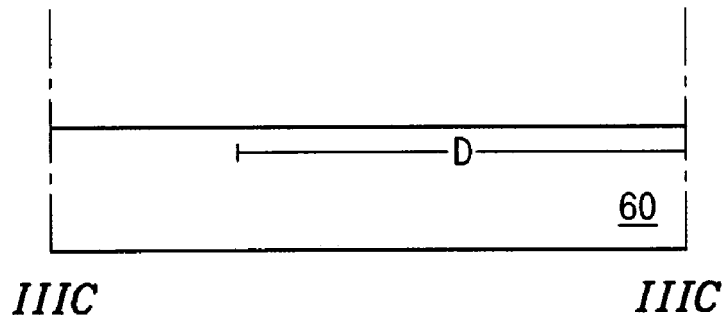
Figure 4A:
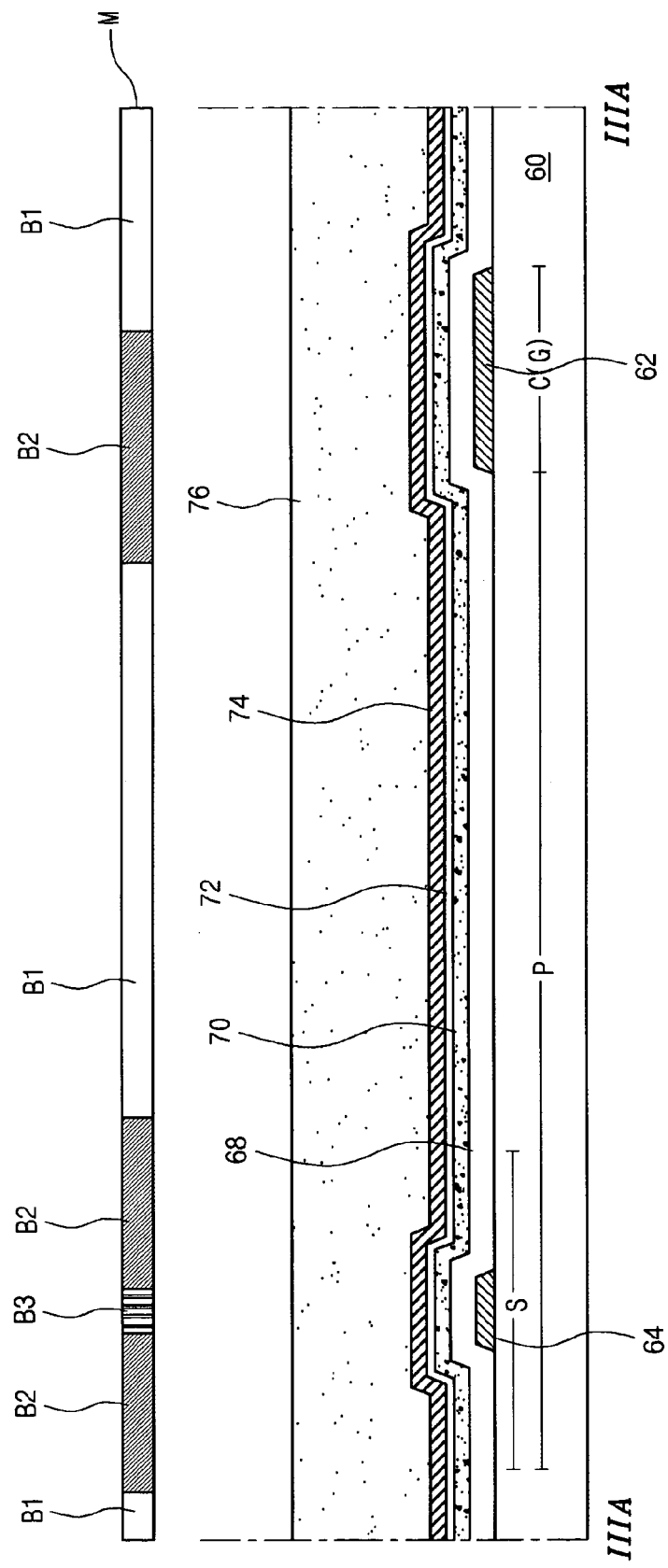
FIGS. 4A to 4C illustrate part of a second mask process of a fabricating method of an array substrate for an LCD device according to the related art.
Figure 4B:
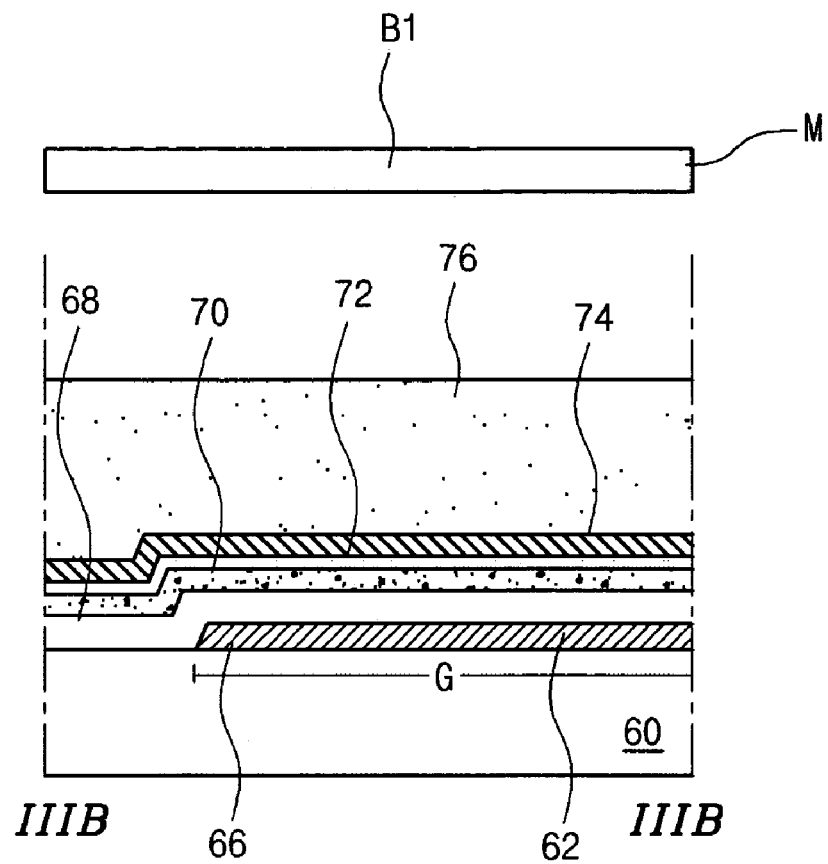
Figure 4C:
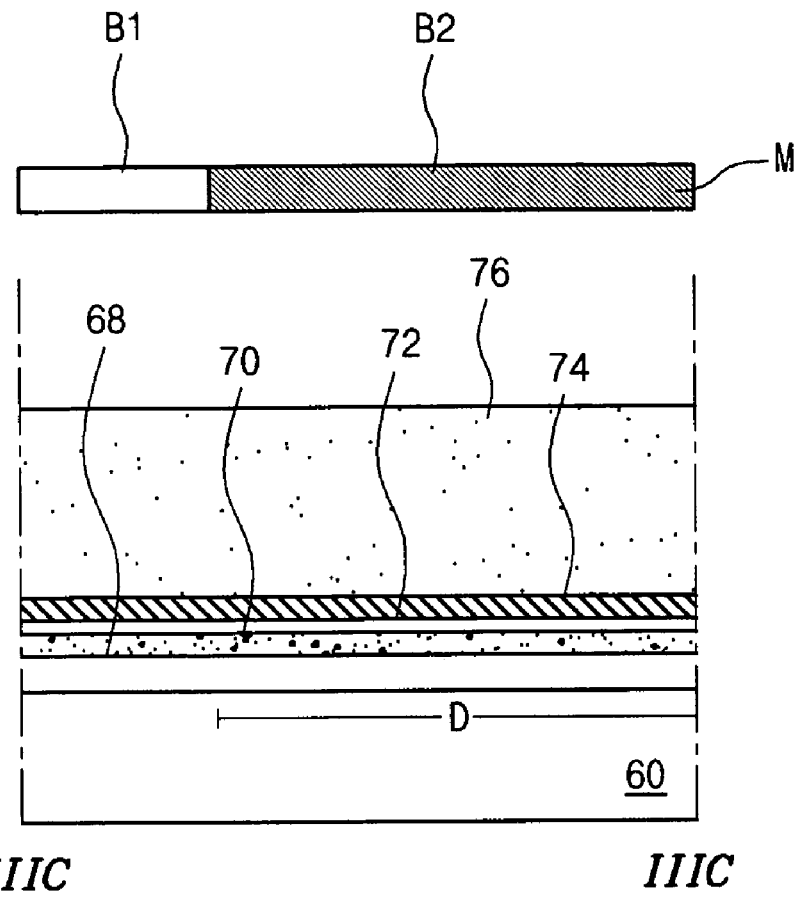
Figure 5A:
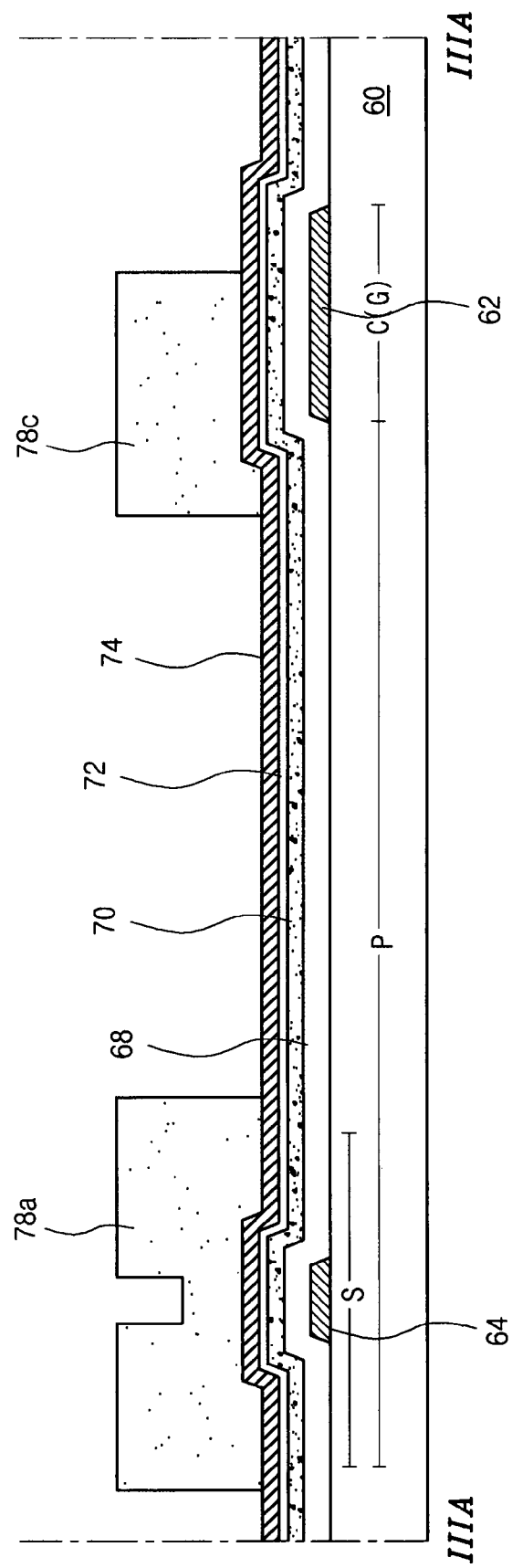
FIGS. 5A to 5C illustrate part of a second mask process of a fabricating method of an array substrate for an LCD device according to the related art.
Figure 5B:
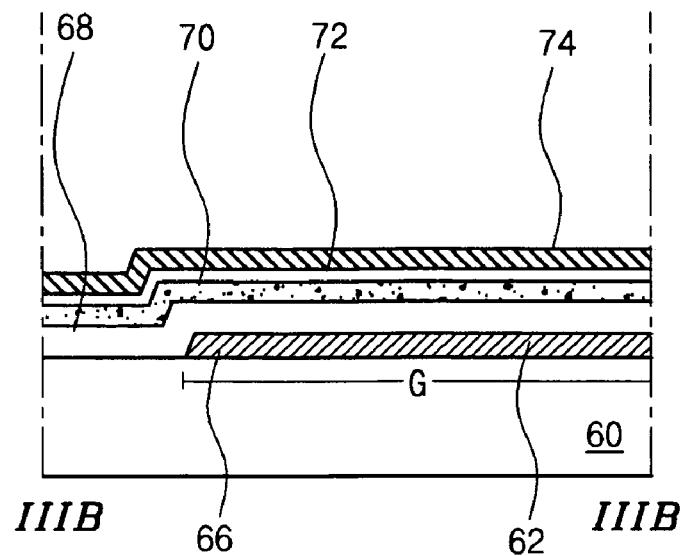
Figure 5C:
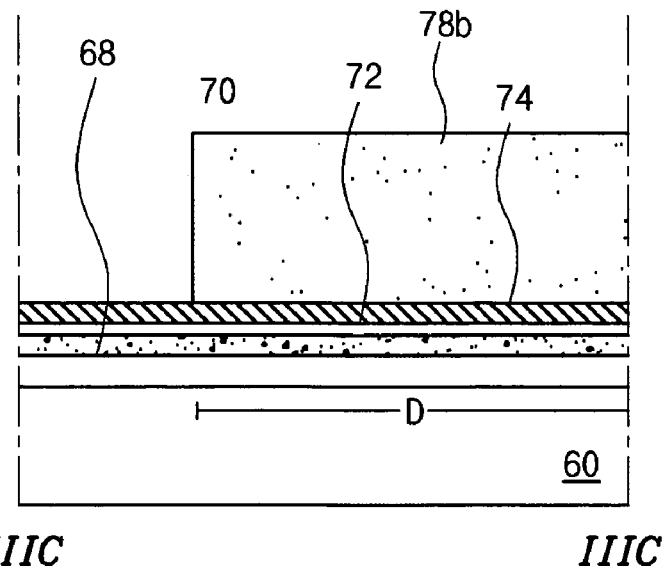
Figure 6A:
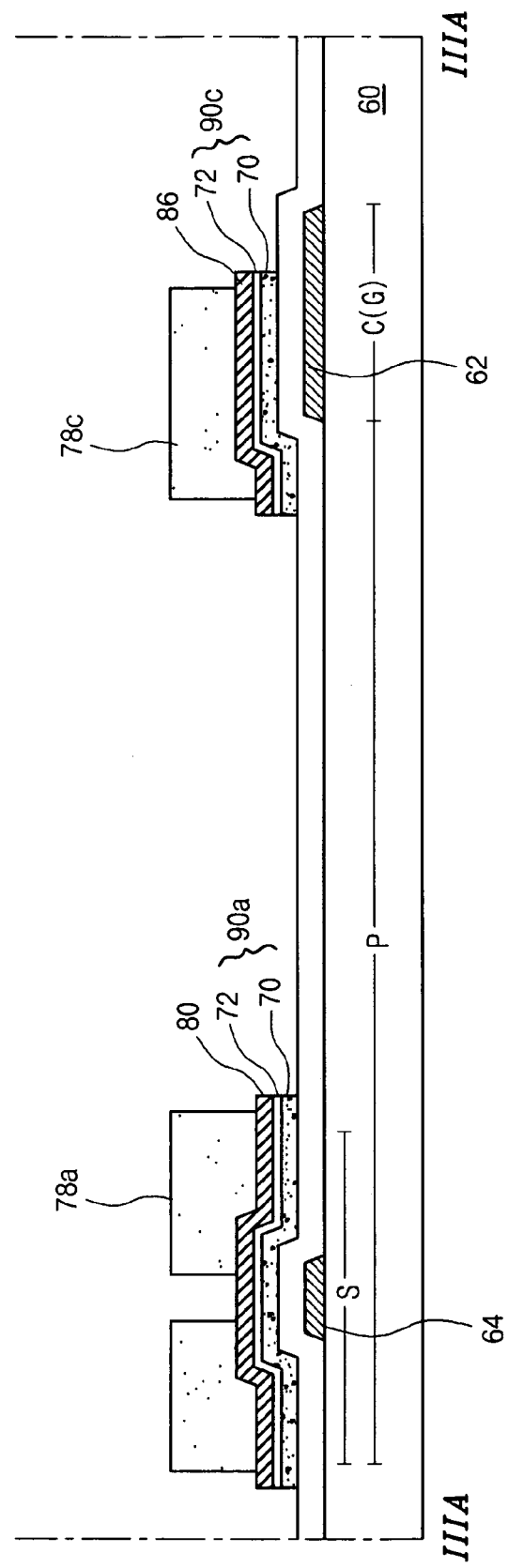
FIGS. 6A to 6C illustrate part of a second mask process of a fabricating method of an array substrate for an LCD device according to the related art.
Figure 6B:
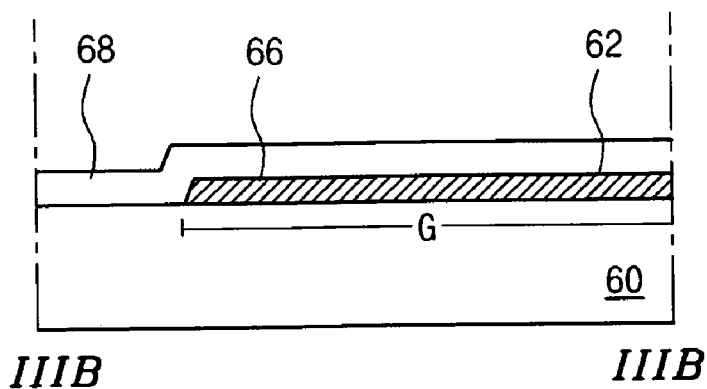
Figure 6C:
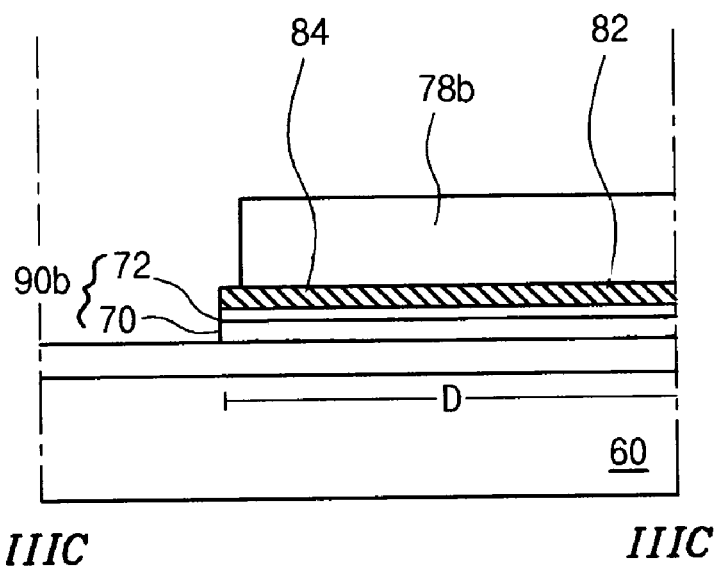
Figure 7A:
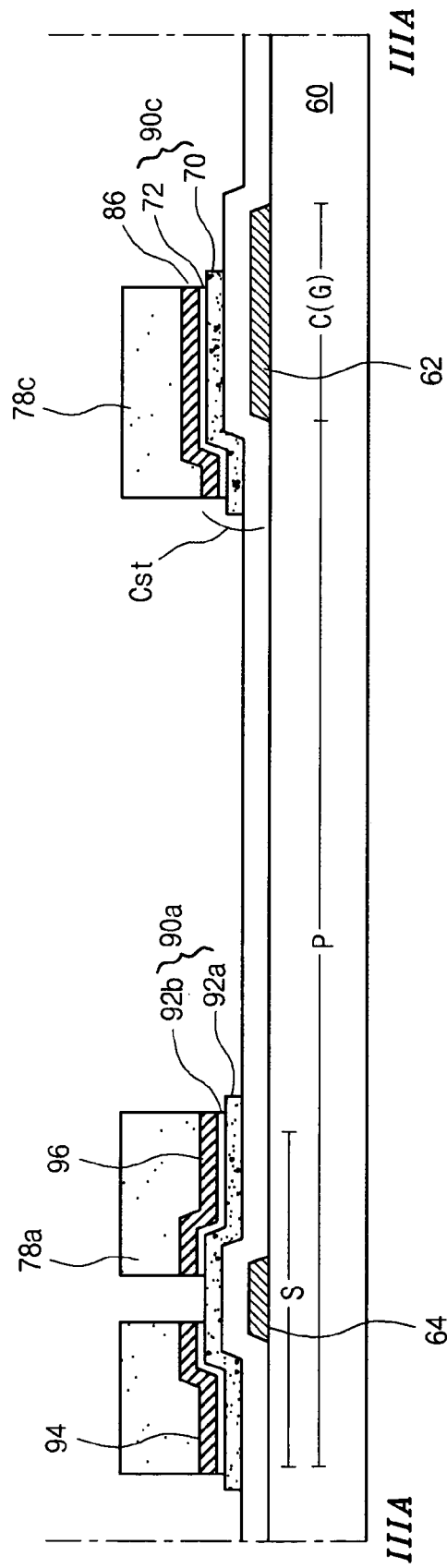
FIGS. 7A to 7C illustrate part of a second mask process of a fabricating method of an array substrate for an LCD device according to the related art.
Figure 7B:
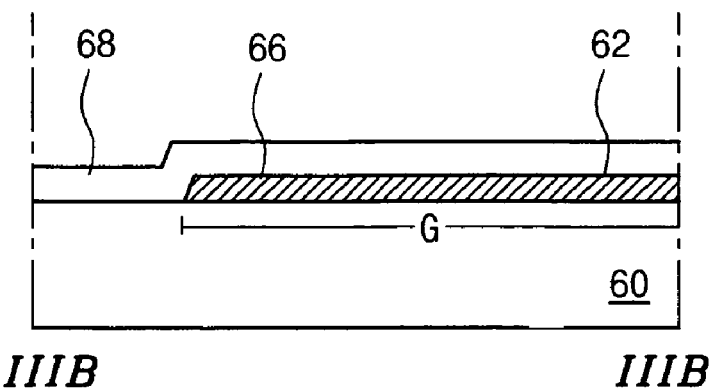
Figure 7C:
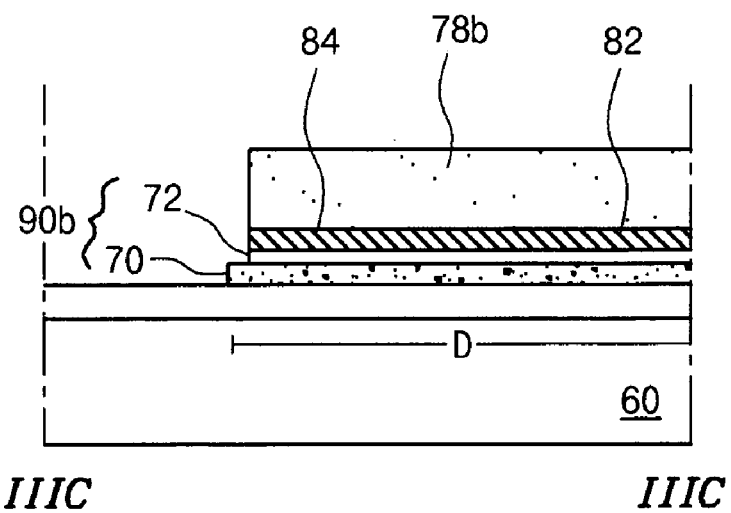
Figure 8A:
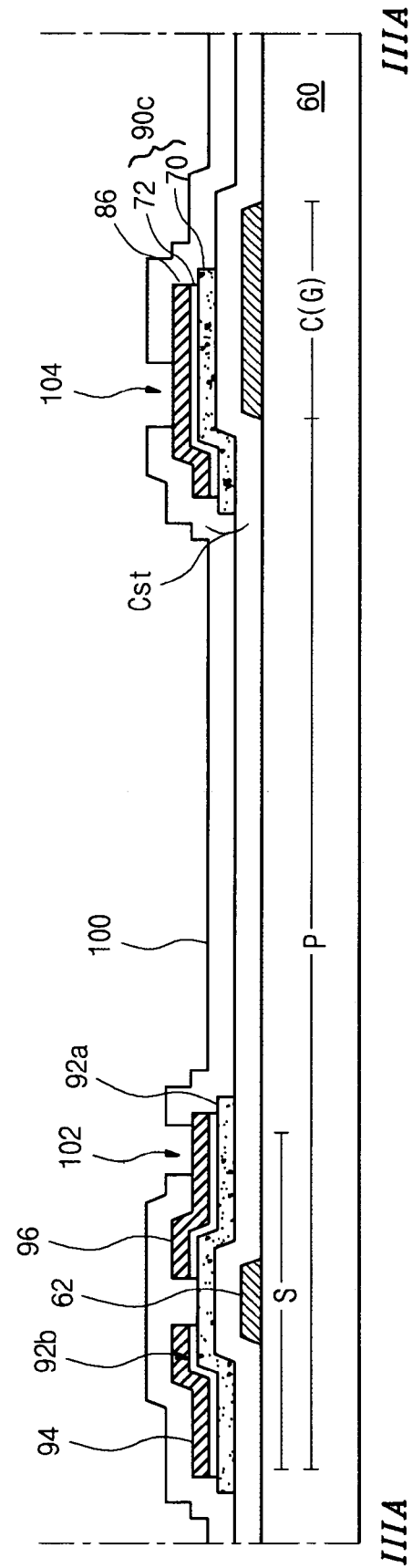
FIGS. 8A to 8C illustrate a third mask process of a fabricating method of an array substrate for an LCD device according to the related art.
Figure 8B:
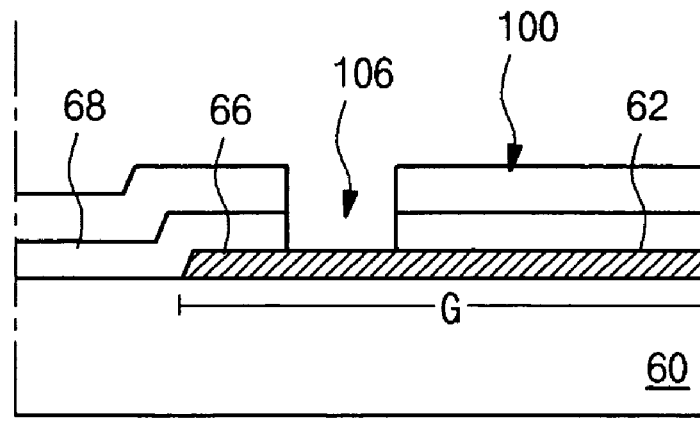
Figure 8C:
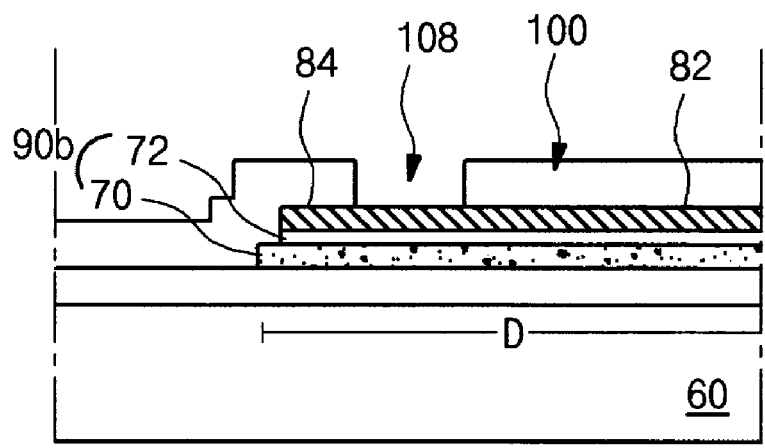
Figure 9A:
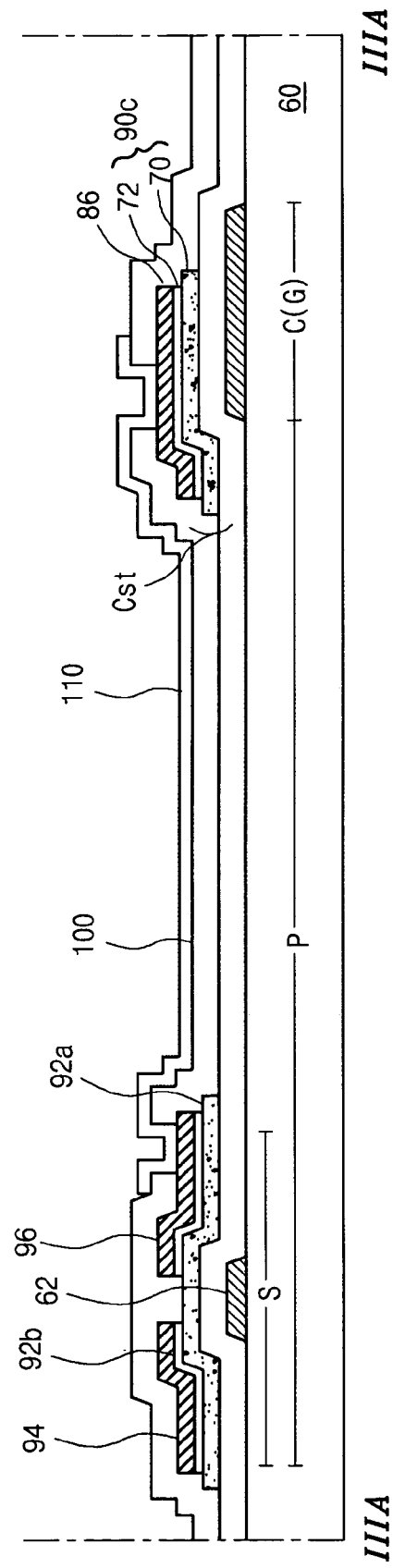
FIGS. 9A to 9C illustrate a fourth mask process of a fabricating method of an array substrate for an LCD device according to the related art.
Figure 9B:
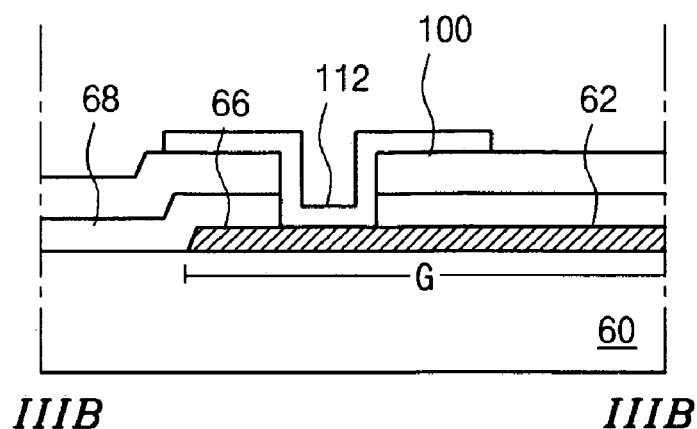
Figure 9C:
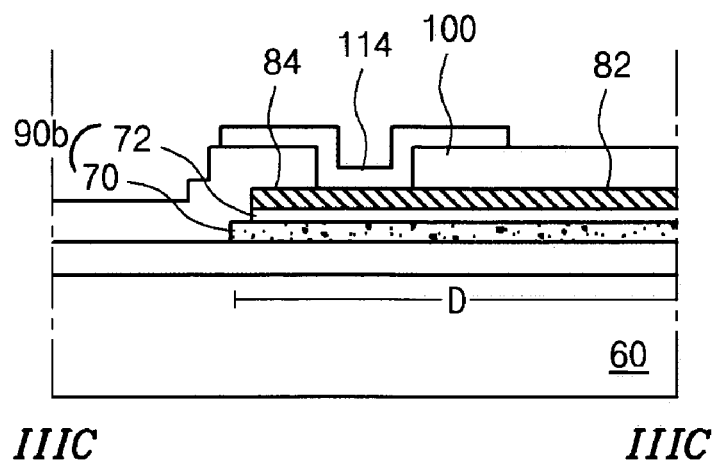
Figure 10:
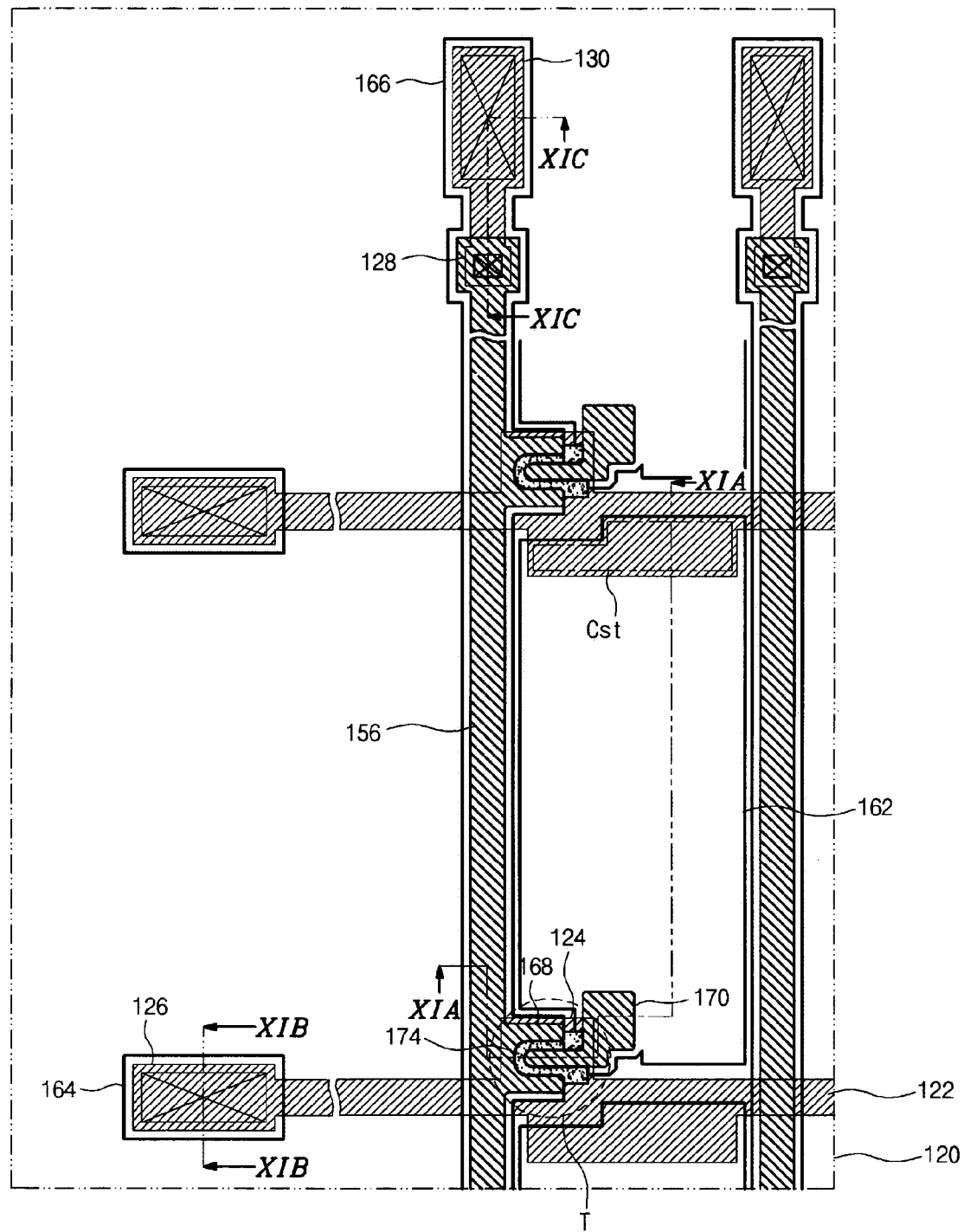
FIG. 10 is a plan view of an array substrate fabricated through three-mask processes according to the present invention.

FIG. 10 is a plan view of an array substrate fabricated through three-mask processes according to the present invention. For convenience of explanation, one pixel region is shown.

As shown in FIG. 10, gate lines 122 are formed along a first direction on a substrate 120, and data lines 156 are formed along a second direction on the substrate 120. The data lines 156 cross the gate lines 122 to thereby define pixel regions. A gate pad 126 is formed at one end of each gate line 122, and a transparent gate pad terminal 164 contacts and covers the gate pad 126. A data pad 130 is formed at one end of each data line 156, and a link portion 128 extending from the data pad 130 is connected to one end of each data line 156 through a transparent data pad terminal 166. The data pad terminal 166 contacts and covers the data pad 130. The data pad 130 and the link portion 128 are formed of the same material and in the same layer as the gate line 122.

A thin film transistor T is formed at each crossing point of the gate and data lines 122 and 156. The thin film transistor T includes a gate electrode 124, an active layer 174, a source electrode 168 and a drain electrode 170. The gate electrode 164 is connected to the gate line 122, and the active layer 174 overlaps the gate electrode 124. The source and drain electrodes 168 and 170 are spaced apart from each other over the active layer 174.

A transparent pixel electrode 162 is formed in each pixel region. The pixel electrode 162 contacts the drain electrode 170.

The pixel electrode 162 overlaps a portion of the gate line 122 to thereby form a storage capacitor Cst. The overlapped gate line 122 functions as a first electrode of the storage capacitor Cst, and the overlapped pixel electrode 162 functions as a second electrode of the storage capacitor Cst.

During a first mask process, a gate line, a gate pad, a gate electrode, a data pad and a link portion are formed. During a second mask process, a data line and an active layer are formed. During the second mask process, a gate pad contact hole, a data pad contact hole and a link hole are also formed. During a third mask process, source and drain electrodes, a pixel electrode, a gate pad terminal and a data pad terminal are formed.

A fabricating method of an array substrate for an LCD device using three-mask processes according to the present invention will be explained hereinafter with reference to attached drawings.

FIG. 11A to FIG. 21C illustrate a fabricating method of an array substrate for an LCD device according to the present invention.

Figure 11A:
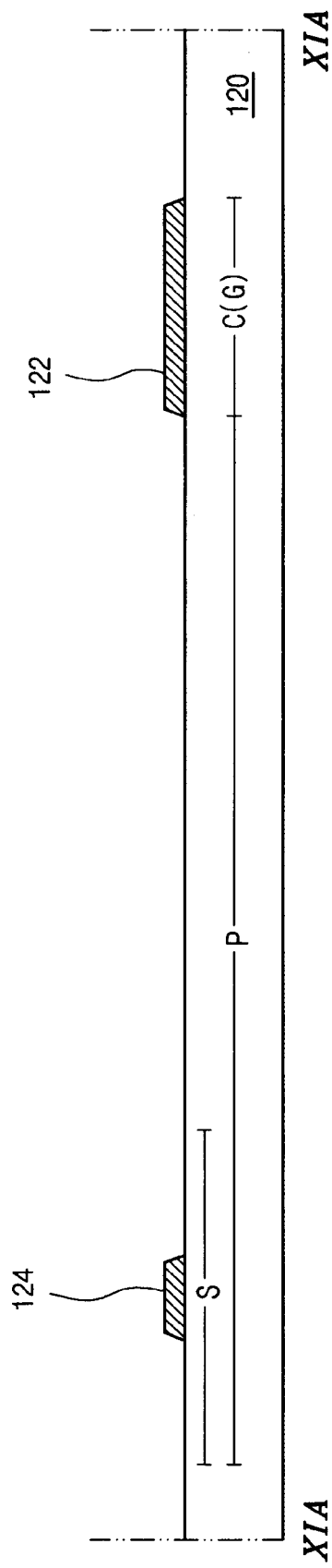
FIGS. 11A to 11C illustrate a first mask process of a fabricating method of an array substrate for an LCD device according to the present invention.
Figure 11B:
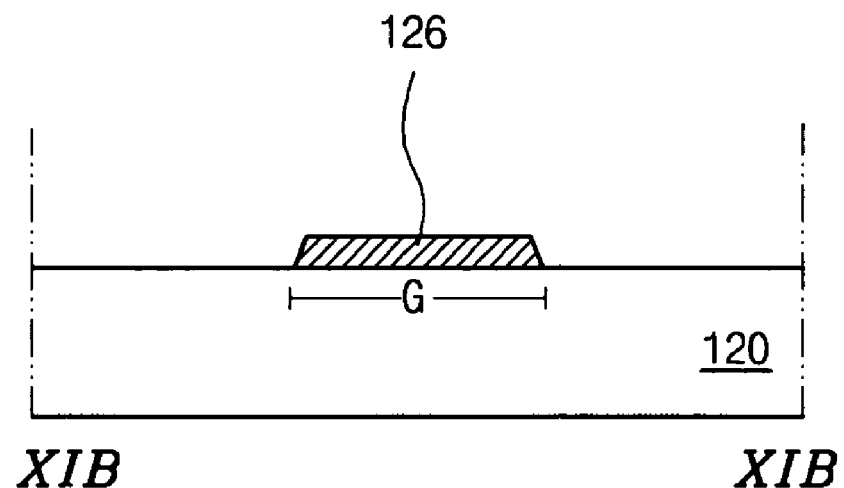
Figure 11C:
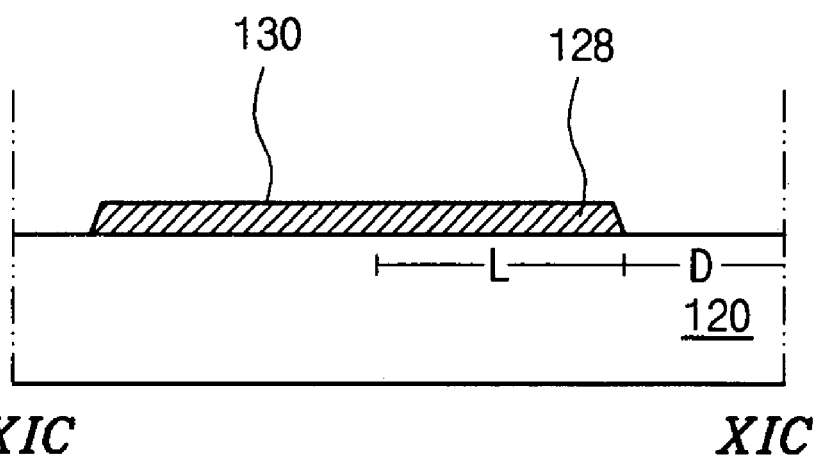

FIGS. 11A, 11B and 11C illustrate a first mask process and correspond to cross-sections along the lines XIA-XIA, XIB-XIB and XIC-XIC of FIG. 10, respectively.

As shown in FIGS. 11A, 11B and 11C, a pixel region P, a storage region C, a gate region G, and a data region D are defined on a substrate 120. The pixel region P includes a switching region S, and the data region D includes a link region L. The storage region C is defined as a part of the gate region G.

A gate line 122, which includes a gate pad 126 at one end thereof, and a gate electrode 124 are formed on the substrate 120 by sequentially depositing and then patterning a metallic material through a first mask process. The gate line 122 and the gate electrode 124 may have a single-layered structure of aluminum (Al), an aluminum alloy such as AlNd, tungsten (W), chromium (Cr), or molybdenum (Mo) or may have a double-layered structure of Al/Cr or Al/Mo. Simultaneously, a data pad 130 and a link portion 128 are formed. The gate electrode 124 is connected to the gate line 122 and is disposed in the switching region S. The gate line 122 is disposed in the gate region G. The link portion 128 extends from the data pad 130 and is disposed in the link region L.

FIG. 12A to FIG. 16C illustrate a second mask process. FIGS. 12A, 13A, 14A, 15A and 16A correspond to cross-sections along the line XIA-XIA of FIG. 10. FIGS. 12B, 13B, 14B, 15B and 16B correspond to cross-sections along the line XIB-XIB of FIG. 10. FIGS. 12C, 13C, 14C, 15C and 16C correspond to cross-sections along the line XIC-XIC of FIG. 10.

Figure 12A:
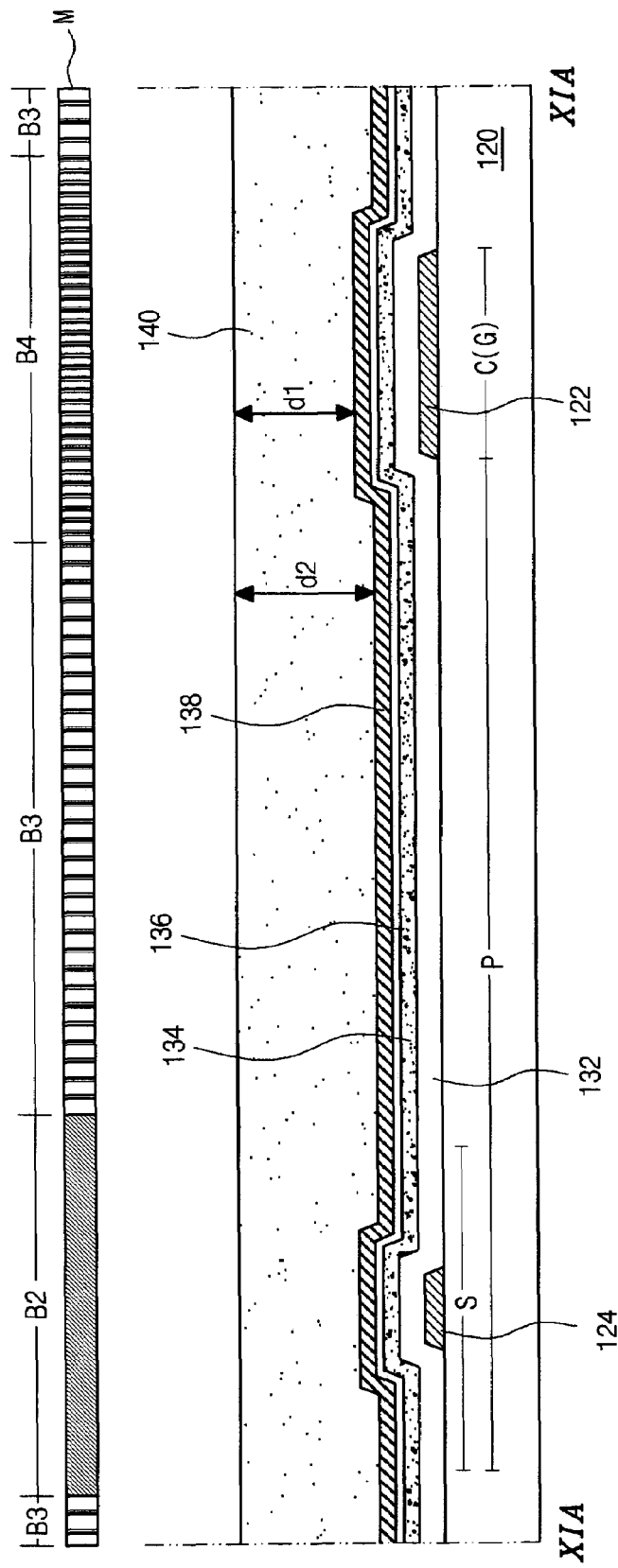
FIGS. 12A to 12C illustrate part of a second mask process of a fabricating method of an array substrate for an LCD device according to the present invention.
Figure 12B:
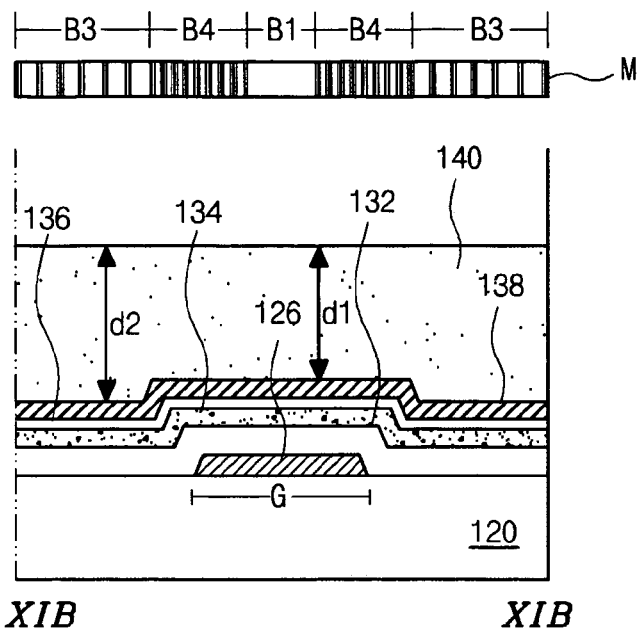
Figure 12C:
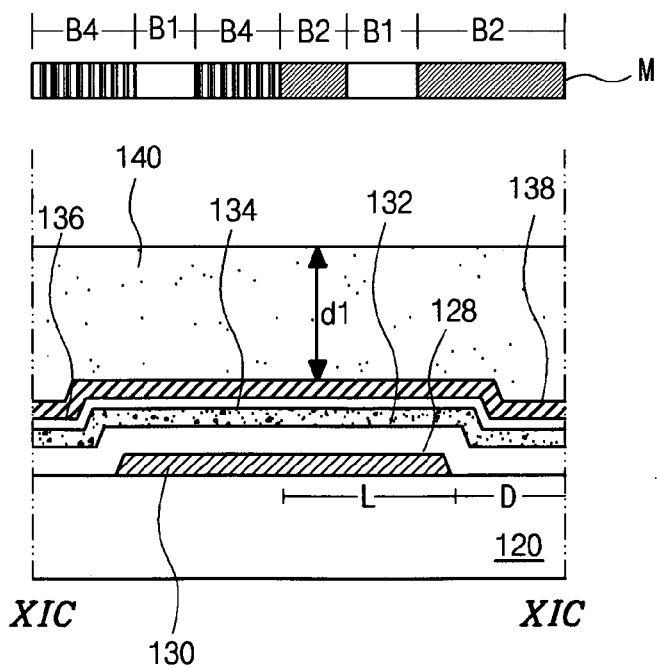

As shown in FIGS. 12A, 12B and 12C, a gate insulating layer 132, an intrinsic amorphous silicon layer (a-Si:H) 134, an impurity-doped amorphous silicon layer (n+ or p+ a-Si:H) 136, and a metal layer 138 are sequentially formed on a substantial part of an entire surface of the substrate 120 including the gate electrode 124, the gate line 122, and the data pad 130 thereon.

The gate insulating layer 132 is formed by depositing a material selected from an inorganic insulating material group including silicon nitride ($SiN_x$) and silicon oxide ($SiO_2$) or an organic insulating material group including benzocyclobutene (BCB) and acrylic resin. The metal layer 138 is formed by depositing one or more materials selected from a metallic material group including aluminum (Al), an aluminum alloy such as AlNd, tungsten (W), chromium (Cr), molybdenum (Mo), a double-layered structure of Al/Cr and a double-layered structure of Al/Mo.

A first photoresist layer 140 is formed on the metal layer 138 by coating. A mask M, which includes a transmitting portion B1, a blocking portion B2, a first half transmitting portion B3, and a second half transmitting portion B4, is disposed over the first photoresist layer 140. The first photoresist layer 140 may be a positive type photoresist. A portion of the first photoresist layer 140 exposed to light is developed and removed. The blocking portion B2 corresponds to the switching region S, the data region D, and the link region L. The second half transmitting portion B4 corresponds to the gate line 122, the gate pad 126 and the data pad 130. The transmitting portion B1 corresponds to parts of the gate pad 126, the data pad 130 and the link portion 128. The first half transmitting portion B3 corresponds to the other regions excluding the above-mentioned regions.

The first photoresist layer 140 may be a negative type photoresist. A portion not exposed to light is developed and removed. The transmitting portion B1 corresponds to the switching region S, the data region D, and the link region L.

The first and second half transmitting portions B3 and B4 have a plurality of patterns and slits between the patterns. The patterns of the first and second half transmitting portions B3 and B4 have a width within a range of about 0.5 μm to about 2.5 μm, and the slits of the first and second half transmitting portions B3 and B4 have a width within a range of about 0.5 μm to about 2.5 μm. In an exemplary embodiment, the first half transmitting portion B3 includes patterns having a width of about 1.4 μm and slits having a width of about 1.3 μm. The second half transmitting portion B4 includes patterns having a width of about 1.5 μm and slits having a width of about 1.2 μm. It may be desirable that the patterns of the first half transmitting portion B3 have a narrower width than the patterns of the second half transmitting portion B4 by about 0.1 μm and the slits of the first half transmitting portion B3 have a wider width than the slits of the second half transmitting portion B4. Accordingly, the intensity of light transmitted through the second half transmitting portion B4 is weaker than the intensity of light transmitted through the first half transmitting portion B3 because the second half transmitting portion B4 includes narrower slits than the first half transmitting portion B3.

This prevents defects on surfaces of metal lines such as the gate line and the gate pad after a dry-etching process by equalizing the thickness of a photoresist layer in a region where the metal lines are formed and in a region where the metal lines are not formed.

Since the first photoresist layer 140 is deposited to be thick, the first photoresist layer 140 has a flat surface. A thickness d1 of the first photoresist layer 140 over the metal lines such as the gate line 122, the gate pad 126 and the data pad 130, i.e., in a region with the metal lines, differs from a thickness d2 of the first photoresist layer 140 in a region without the metal lines. The thickness d2 of the first photoresist layer 140 in the region without the metal lines is thicker than the thickness d1 of the first photoresist layer 140 in the region with the metal lines.

When the first photoresist layer 140 corresponding to the first and second half transmitting portions B3 and B4 is subjected to an ashing process, a part of the first photoresist layer 140 in the region with the metal lines, which corresponds to the second half transmitting portion B4, is removed to thereby expose the metal layer 138 before a part of the first photoresist layer 140 in the region without the metal lines, which corresponds to the first half transmitting portion B3, is not completely removed. If the part of the first photoresist layer 140 corresponding to the first half transmitting portion B3 is completely removed, the metal layer 138 in the region with the metal lines may be partially removed. Thus, when the metal layer 138 and the layers thereunder are removed, the metal layer 138 and the layers thereunder over the metal lines may be further etched to thereby cause defects on the surfaces of the metal lines.

Accordingly, in the present invention, the slits of the second half transmitting portion B4 have a narrower width than the slits of the first half transmitting portion B3, and thus the intensity of light transmitted through the second half transmitting portion B4 becomes weak compared to the intensity of light transmitted through the first half transmitting portion B3. The first photoresist layer 140 in the region without the metal lines is more completely removed than the first photoresist layer 140 in the region with the metal lines to thereby equalize the thicknesses d1 and d2 of the first photoresist layer 140.

Then, the first photoresist layer 140 is exposed to light through the mask M and then is developed.

Figure 13A:
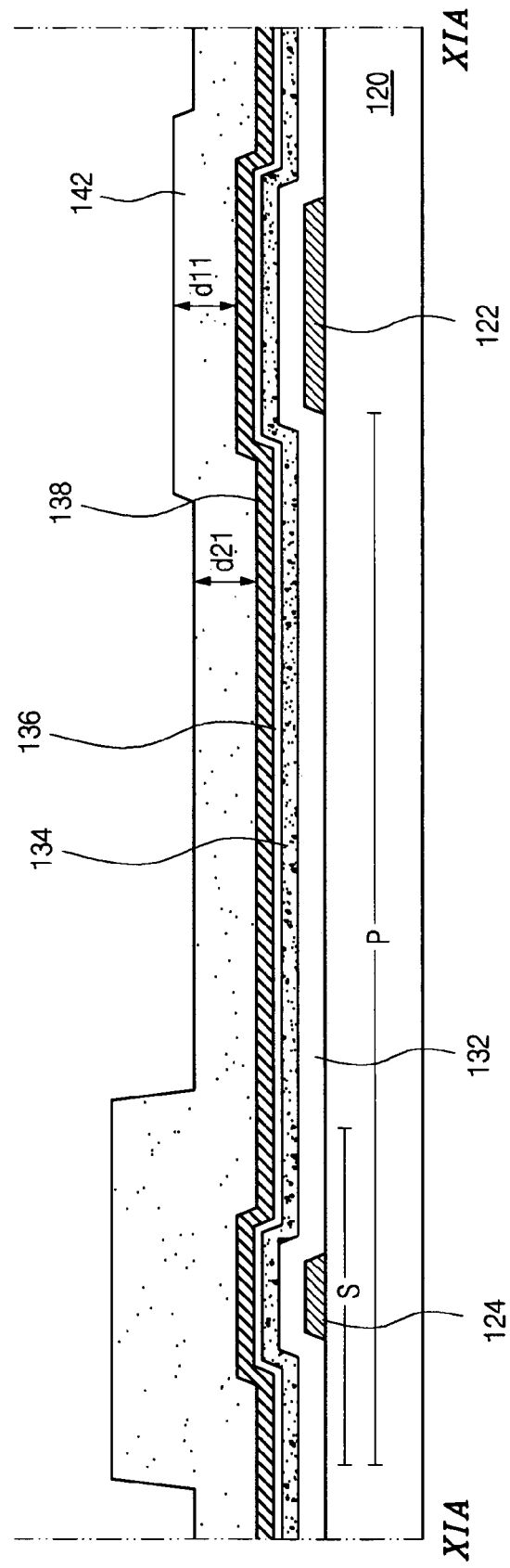
FIGS. 13A to 13C illustrate part of a second mask process of a fabricating method of an array substrate for an LCD device according to the present invention.
Figure 13B:
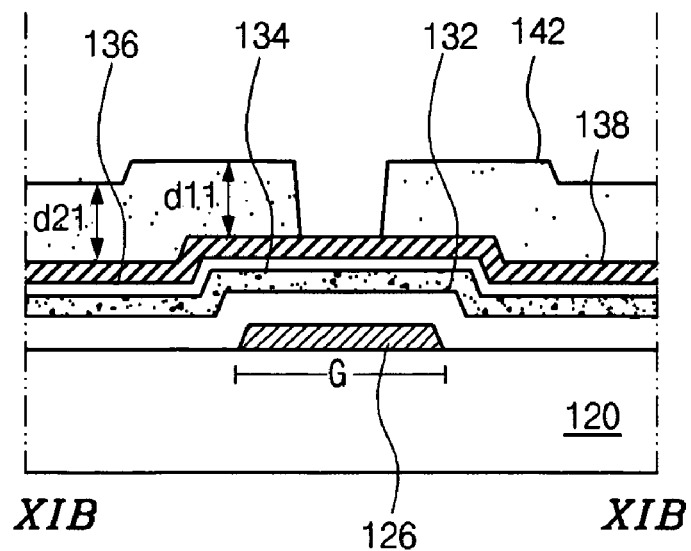
Figure 13C:
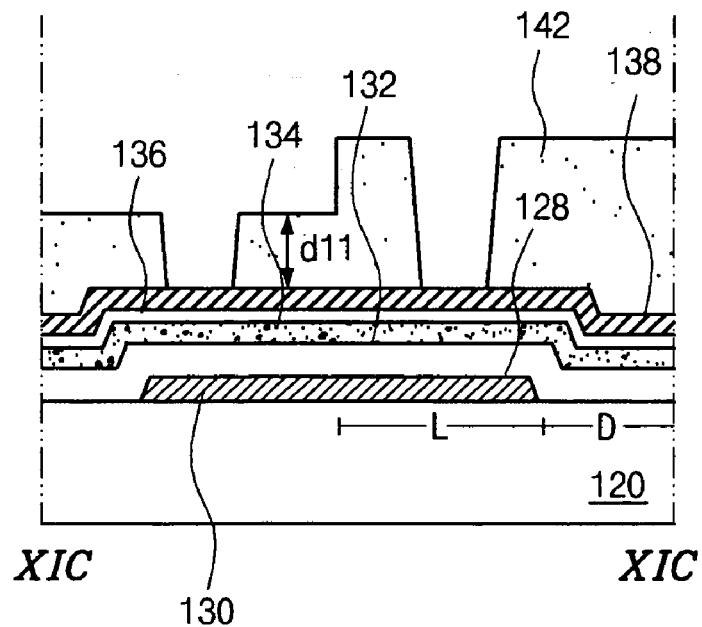

As shown in FIGS. 13A, 13B and 13C, a first photoresist pattern 142 is formed. The first photoresist pattern 142 exposes the metal layer 138 over the gate pad 126, the data pad 130 and the link portion 128 corresponding to the transmitting portion B1 of the mask M. The first photoresist pattern 142 includes a first part corresponding to the blocking portion B2 and a second part corresponding to the first and second half transmitting portions B3 and B4. The first part of the first photoresist pattern 142 is thicker than the second part of the first photoresist pattern 142. A thickness d11 of the second part corresponding to the gate line 122, the gate pad 126 and the data pad 130 is approximately equal to a thickness d21 of the second part corresponding to the region without the gate line 122, the gate pad 126 and the data pad 130.

Figure 14A:
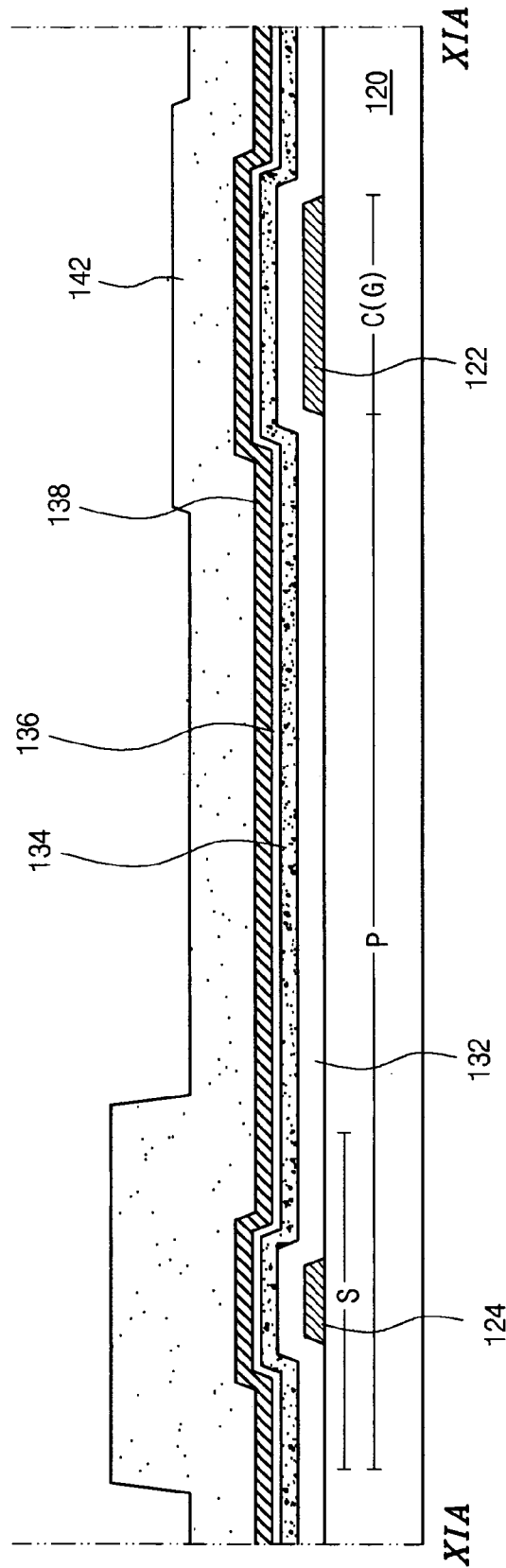
FIGS. 14A to 14C illustrate part of a second mask process of a fabricating method of an array substrate for an LCD device according to the present invention.
Figure 14B:
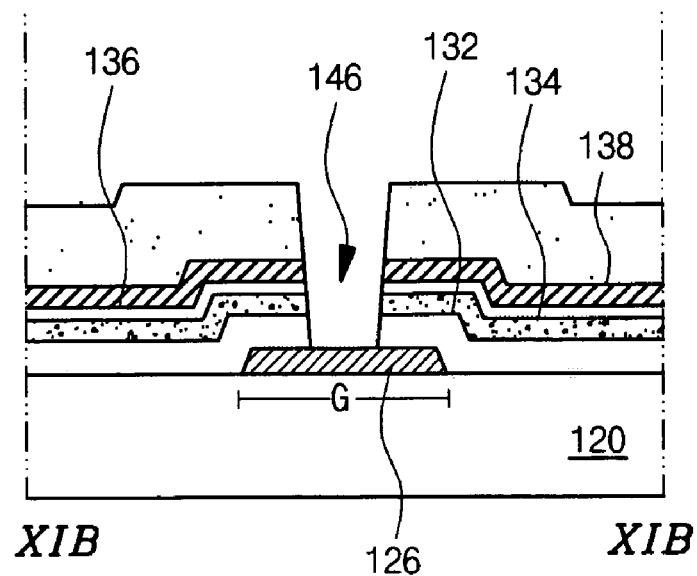
Figure 14C:
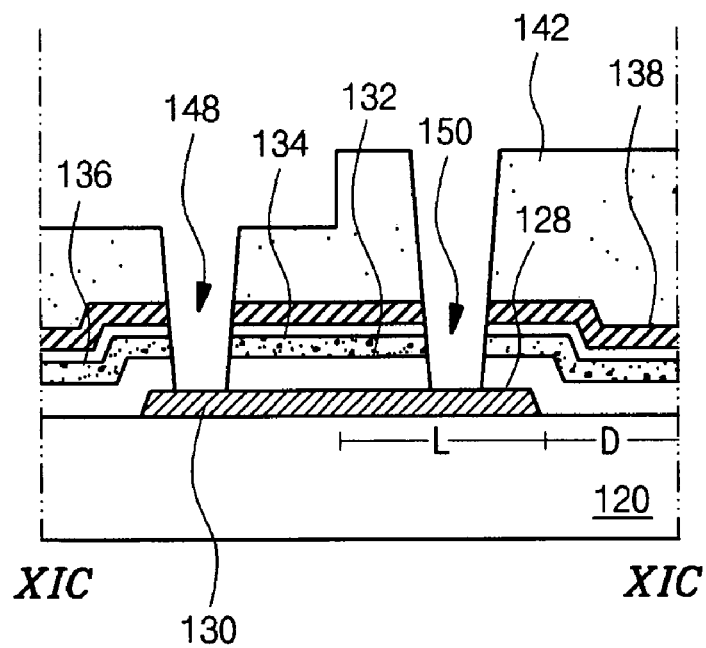

Then, as shown in FIGS. 14A, 14B and 14C, the exposed metal layer 138, the impurity-doped amorphous silicon layer 136, the intrinsic amorphous silicon layer 134, and the gate insulating layer 132, which correspond to the gate pad 122, the data pad 130 and the link portion 128, are removed by using the first photoresist pattern 142 as an etching mask. Accordingly, a gate pad contact hole 146, a data pad contact hole 148 and a link hole 150 are formed. The gate pad contact hole 146, the data pad contact hole 148 and the link hole 150 expose the gate pad 126, the data pad 130 and the link portion 128, respectively. The metal layer 138 may be removed simultaneously with the layers thereunder depending on a material of the metal layer 138. Alternatively, after the metal layer 138 is etched, the layers thereunder may be etched.

Figure 15A:
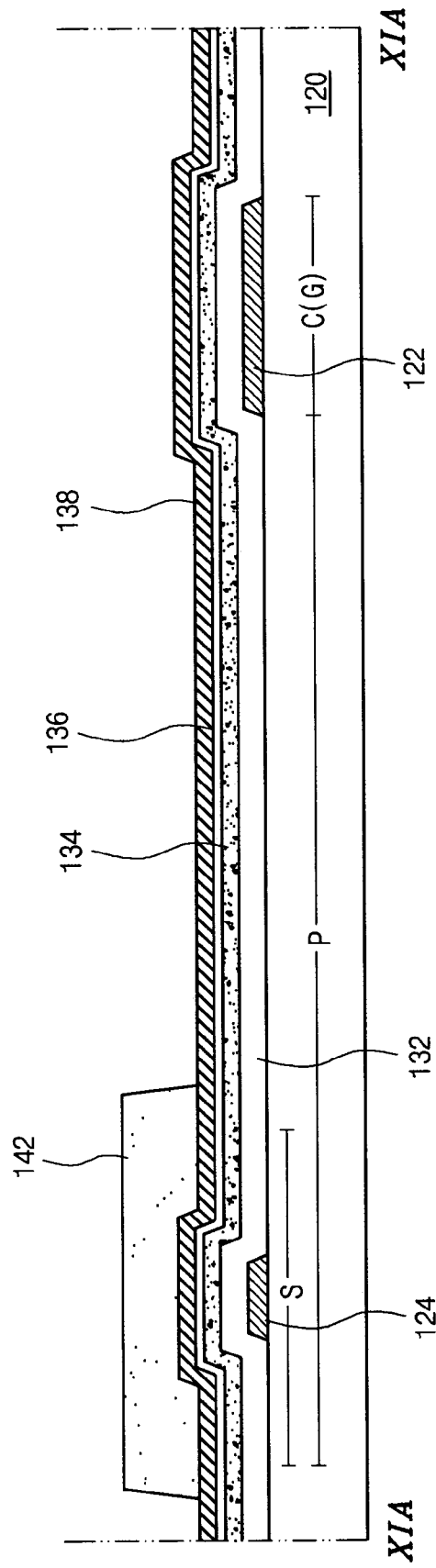
FIGS. 15A to 15C illustrate part of a second mask process of a fabricating method of an array substrate for an LCD device according to the present invention.
Figure 15B:
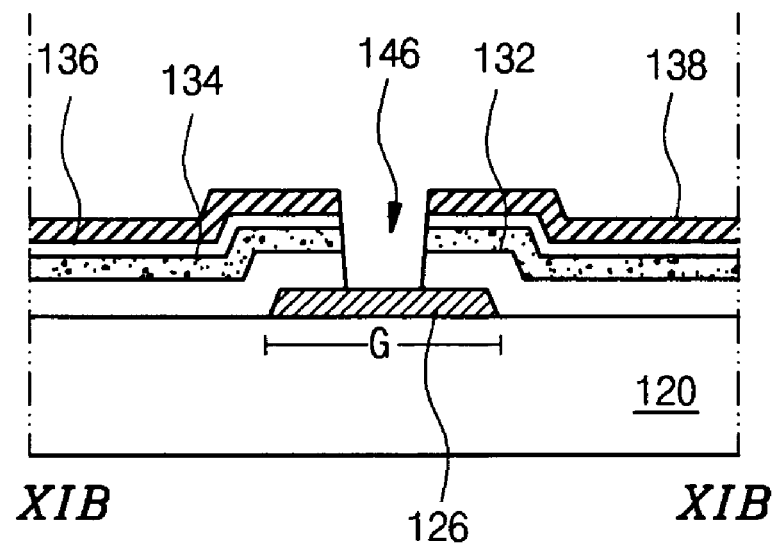
Figure 15C:
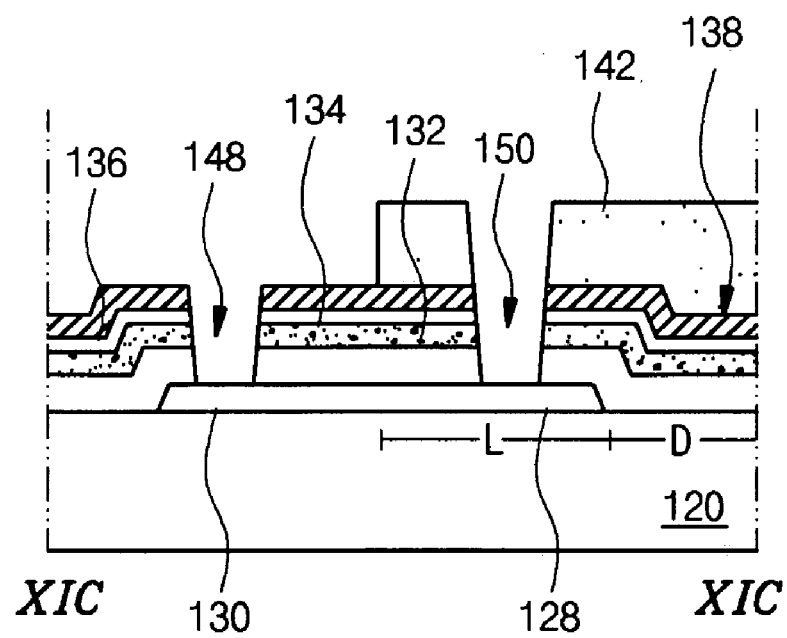

As shown in FIGS. 15A, 15B and 15C, the second part of the first photoresist pattern 142 is removed through an ashing process. Therefore, the first part of the first photoresist pattern 142 remains in the switching region S and the data region D. The metal layer 138 is exposed in regions except for the switching region S, region L and the data region D. Since the thickness of the second part of the first photoresist pattern 142 in the region with the metal lines such as the gate line 122, the gate pad 126 and the data pad is equal to the thickness of the second part of the first photoresist pattern 142 in the region without the metal lines, the second part of the first photoresist pattern 142 is uniformly etched in the region with the metal lines and in the region without the metal lines. Accordingly, problems on the surface of the metal lines may be prevented.

Then, the first part of the first photoresist pattern 142, which corresponds to the switching region S and the data region D, is partially removed, and the thickness of the first part is reduced.

Figure 16A:
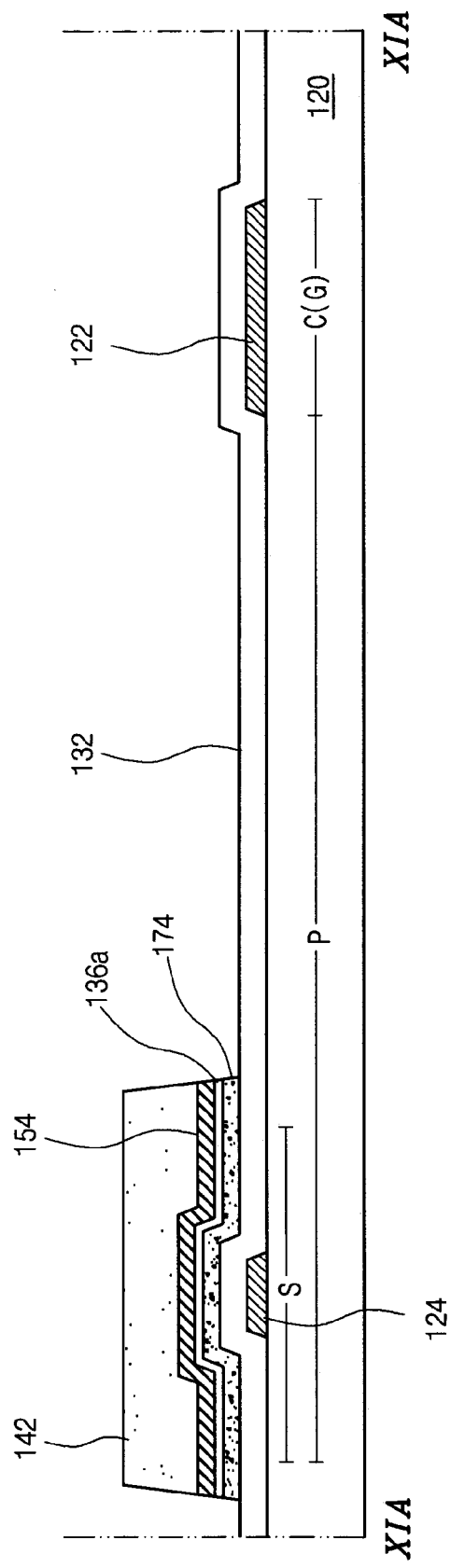
FIGS. 16A to 16C illustrate part of a second mask process of a fabricating method of an array substrate for an LCD device according to the present invention.
Figure 16B:
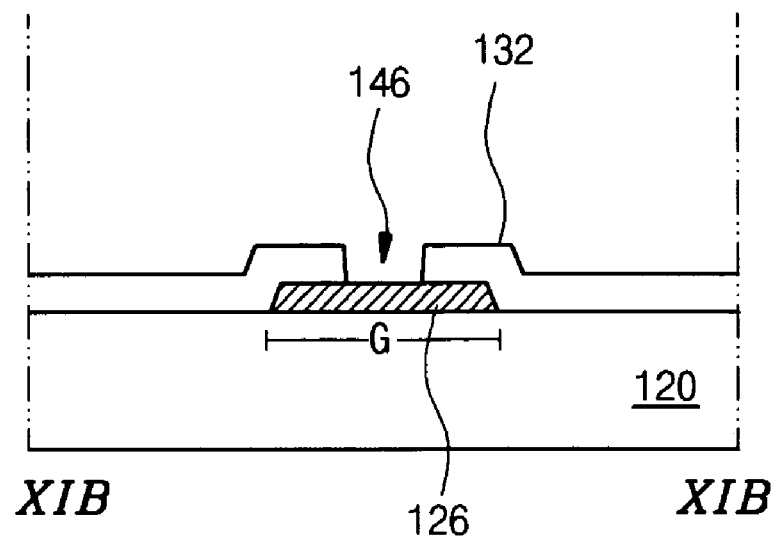
Figure 16C:
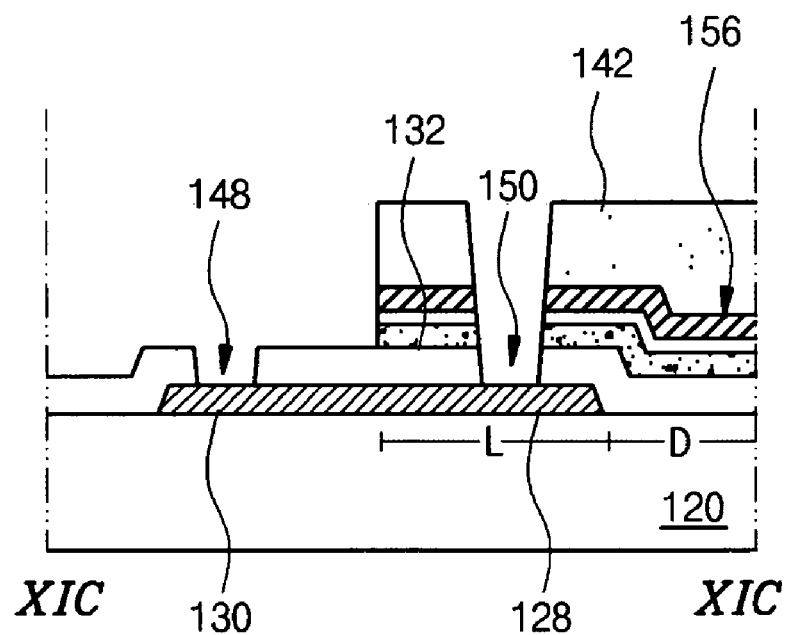

As shown in FIGS. 16A, 16B and 16C, the exposed metal layer 138 and the under layers 134 and 136 in the regions except for the switching region S and the data region D are removed by using the first part of the first photoresist pattern 142 as an etching mask. Thus, the gate insulating layer 132 remains in the regions except for the switching region S and the data region D. In addition, a source-drain pattern 154, an impurity-doped amorphous silicon pattern 136a and an active layer 174 are formed in the switching region S, and a data line 156 is formed in the data region D. The data line 156 extends from the source-drain pattern 154. Simultaneously, the impurity-doped amorphous silicon layer 136 and the intrinsic amorphous silicon layer 134 are patterned and remain under the data line 156.

Then, the first part of the first photoresist pattern 142 on the source-drain pattern 154 and the data line 156 is removed. Thus, the second mask process is performed.

FIG. 17A through 21C illustrate a third mask process. FIGS. 17A, 18A, 19A, 20A and 21A correspond to cross-sections along the line XIA-XIA of FIG. 10. FIGS. 17B, 18B, 19B, 20B and 21B correspond to cross-sections along the line XIB-XIB of FIG. 10. FIGS. 17C, 18C, 19C, 20C and 21C correspond to cross-sections along the line XIC-XIC of FIG. 10.

Figure 17A:
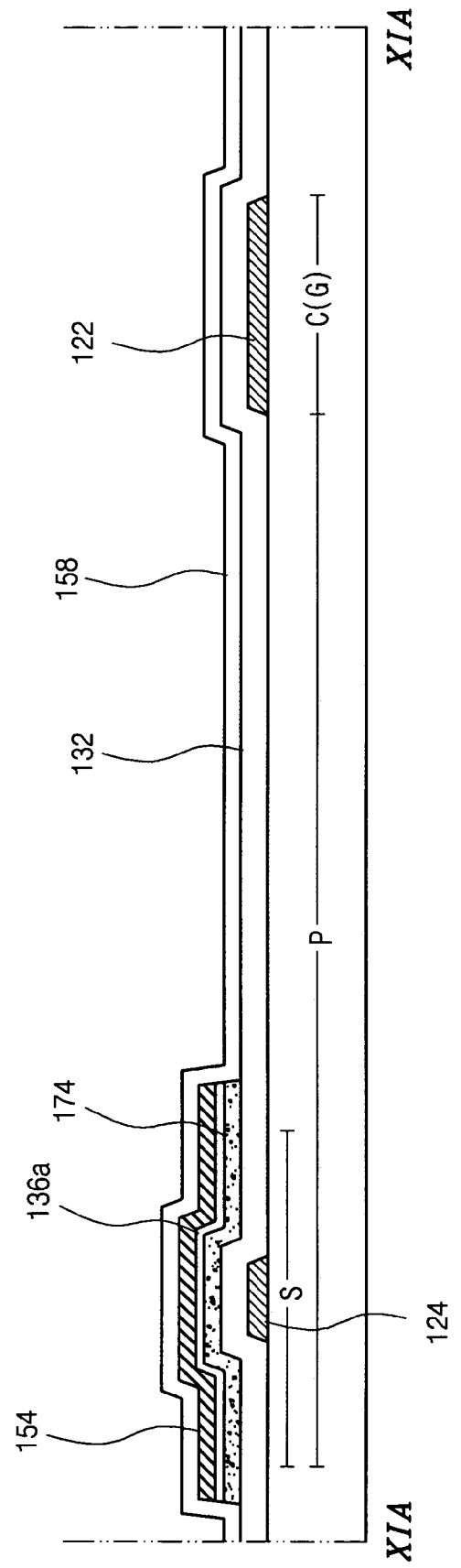
FIGS. 17A to 17C illustrate part of a third mask process of a fabricating method of an array substrate for an LCD device according to the present invention.
Figure 17B:
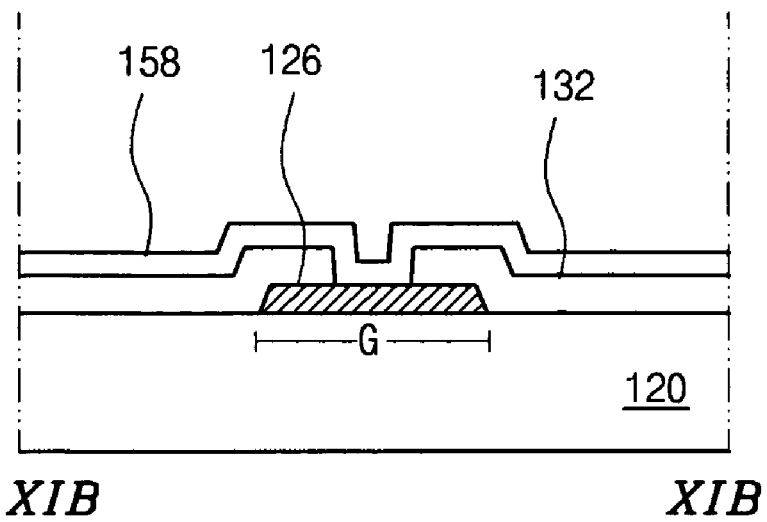
Figure 17C:
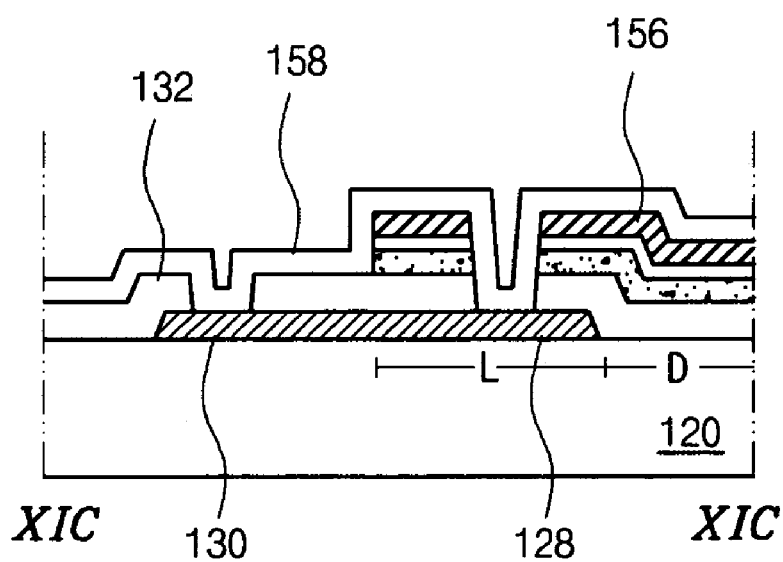

As shown in FIGS. 17A, 17B and 17C, a transparent conductive layer 158 is formed on a substantial part of an entire surface of the substrate 120 including the source-drain metal pattern 154 and the data line 156 thereon by depositing a material selected from a transparent conductive material group including indium tin oxide (ITO) and indium zinc oxide (IZO).

Figure 18A:
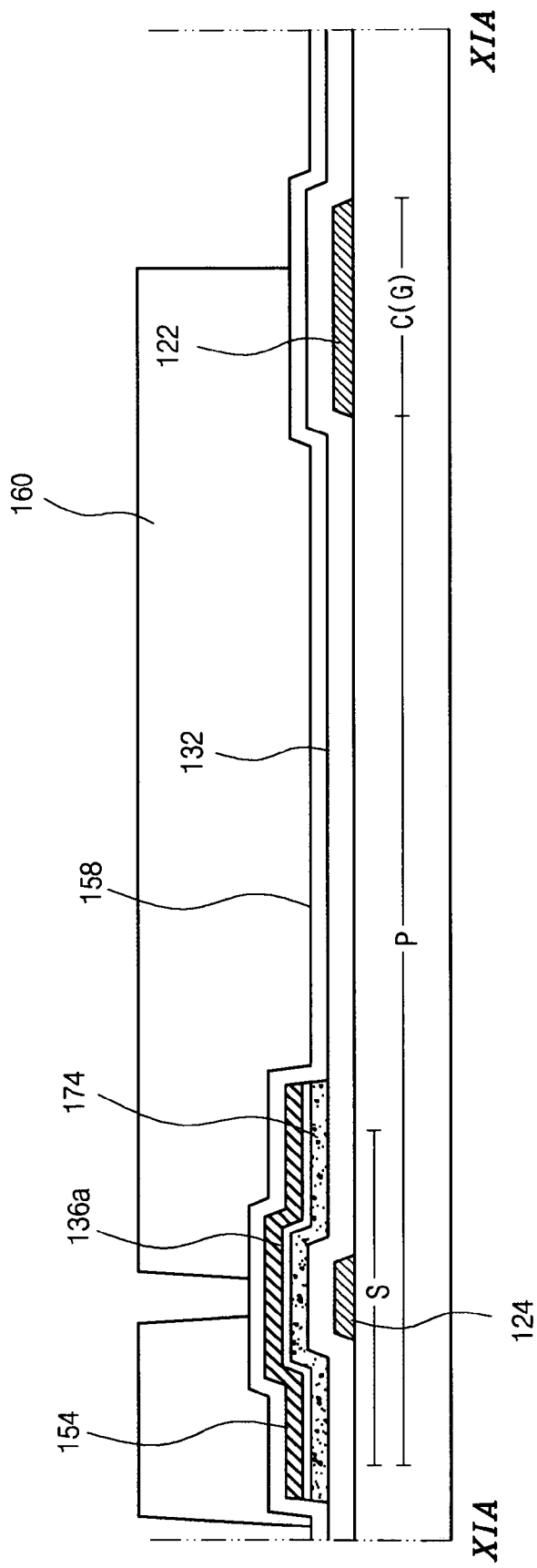
FIGS. 18A to 18C illustrate part of a third mask process of a fabricating method of an array substrate for an LCD device according to the present invention.
Figure 18B:
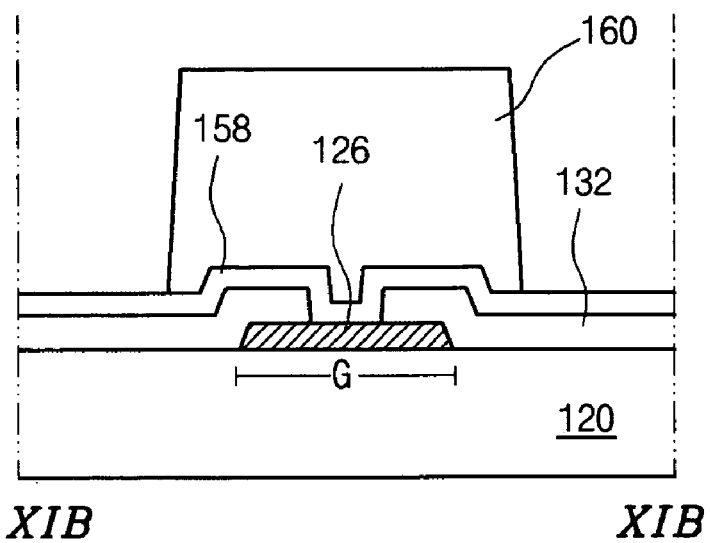
Figure 18C:
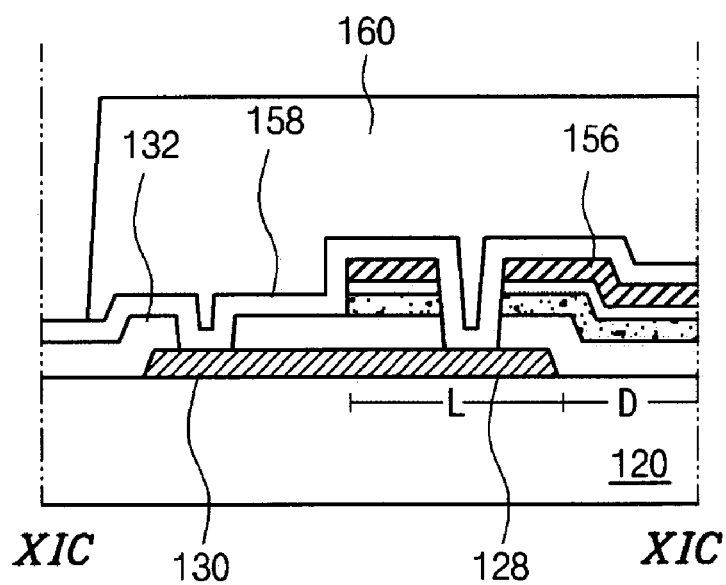

As shown in FIGS. 18A, 18B and 18C, a photoresist is coated to form a second photoresist layer on a substantial part of an entire surface of the substrate 120 including the transparent conductive layer 158 thereon. Then, the second photoresist layer is exposed to light and then is developed to thereby form a second photoresist pattern 160. The second photoresist pattern 160 corresponds to the switching region S, the pixel region P, the storage region C, the gate pad 126, the data pad 130, and the link portion 128. The second photoresist pattern 160 is selectively removed in the switching region S to thereby expose the transparent conductive layer 158 over the gate electrode 124.

Figure 19A:
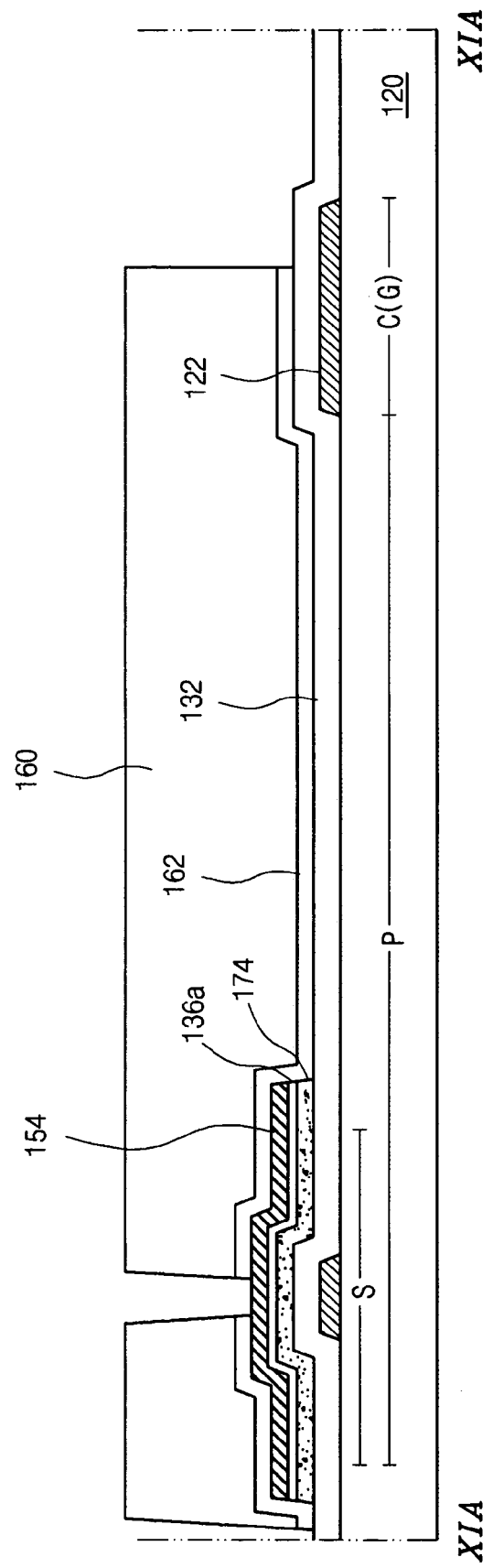
FIGS. 19A to 19C illustrate part of a third mask process of a fabricating method of an array substrate for an LCD device according to the present invention.
Figure 19B:
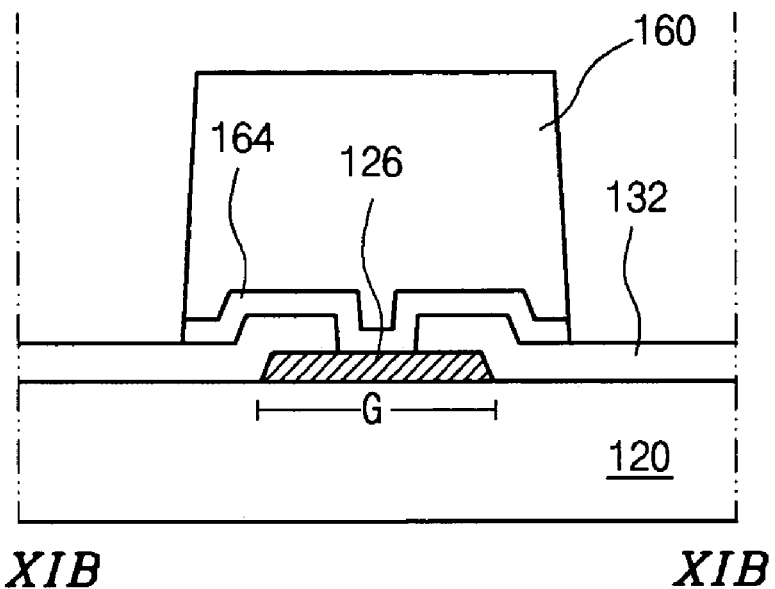
Figure 19C:
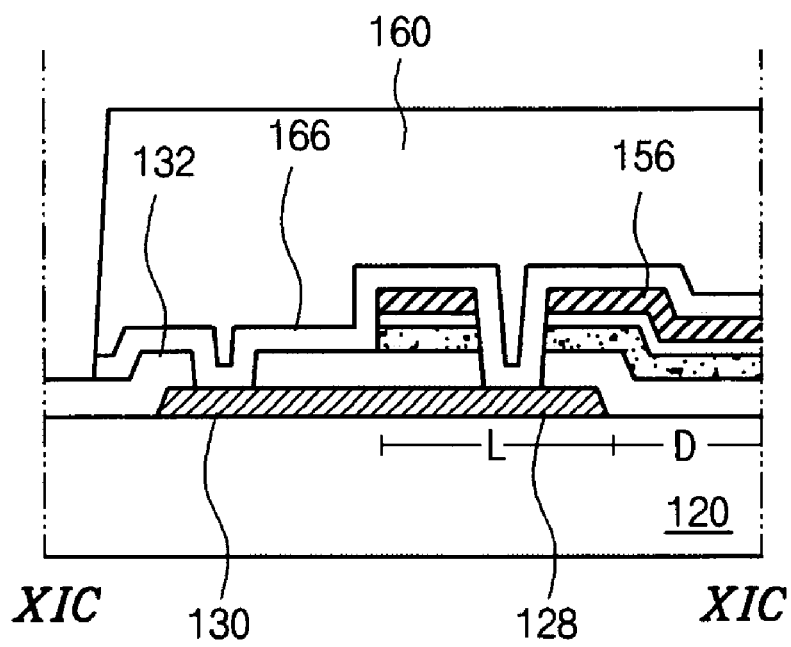

As shown in FIGS. 19A, 19B and 19C, the exposed transparent conductive layer 158 is removed by using the second photoresist pattern 160 as an etching mask. Thus, a pixel electrode 162 is formed in the pixel region P. The pixel electrode 162 overlaps one part of the source-drain pattern 154 and a part of the gate line 122 in the storage region C.

Simultaneously, a gate pad terminal 164 and a data pad terminal 166 are formed. The gate pad terminal 164 covers the gate pad 126 and contacts the gate pad 126 through the gate pad contact hole 146. The data pad terminal 166 contacts the data pad 130 through the data pad contact hole 148 and the link portion 128 through the link hole 150. The data pad terminal 166 covers and contacts one end of the data line 156. Thus, the data pad terminal 166 electrically connects the data line 156 and the data pad 130. A transparent conductive pattern extending from the data pad terminal 166 covers the data line 156 and the other part of the source-drain pattern 154.

Figure 20A:
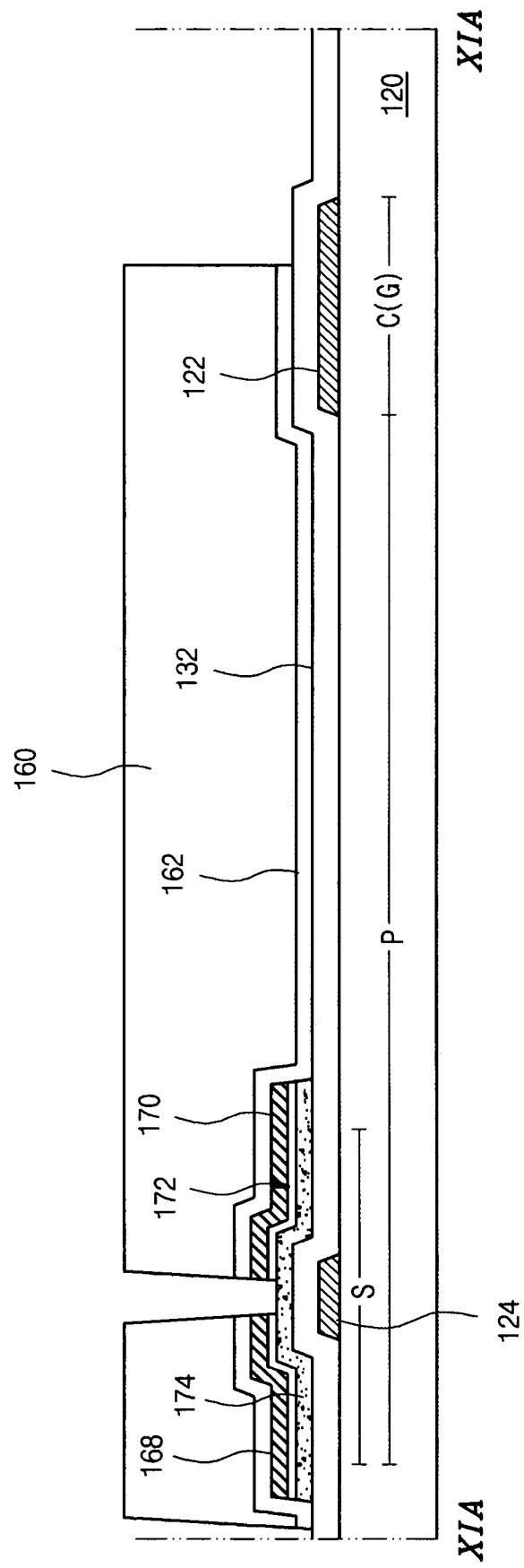
FIGS. 20A to 20C illustrate part of a third mask process of a fabricating method of an array substrate for an LCD device according to the present invention.
Figure 20B:
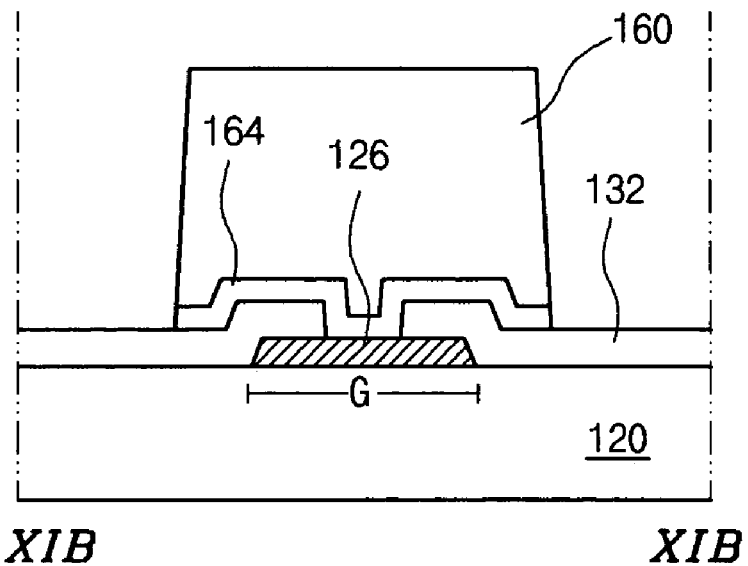
Figure 20C:
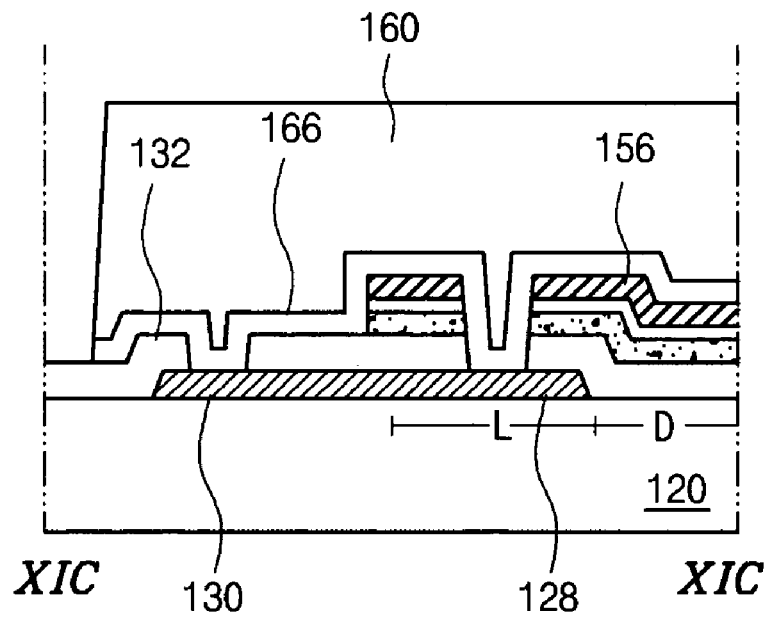

As shown in FIGS. 20A, 20B and 20C, the source-drain pattern 154, which is exposed by the transparent conductive pattern and the pixel electrode 162 in the switching region S, and the impurity-doped amorphous silicon pattern 136a thereunder are removed to thereby form source and drain electrodes 168 and 170 and an ohmic contact layer 172. The source and drain electrodes 168 and 170 are spaced apart from each other over the gate electrode 124. The ohmic contact layer 172 is disposed under the source and drain electrodes 168 and 170. The active layer 174 under the ohmic contact layer 172 is exposed between the source and drain electrodes 168 and 170. Then, the second photoresist pattern 160 is removed.

Figure 21A:
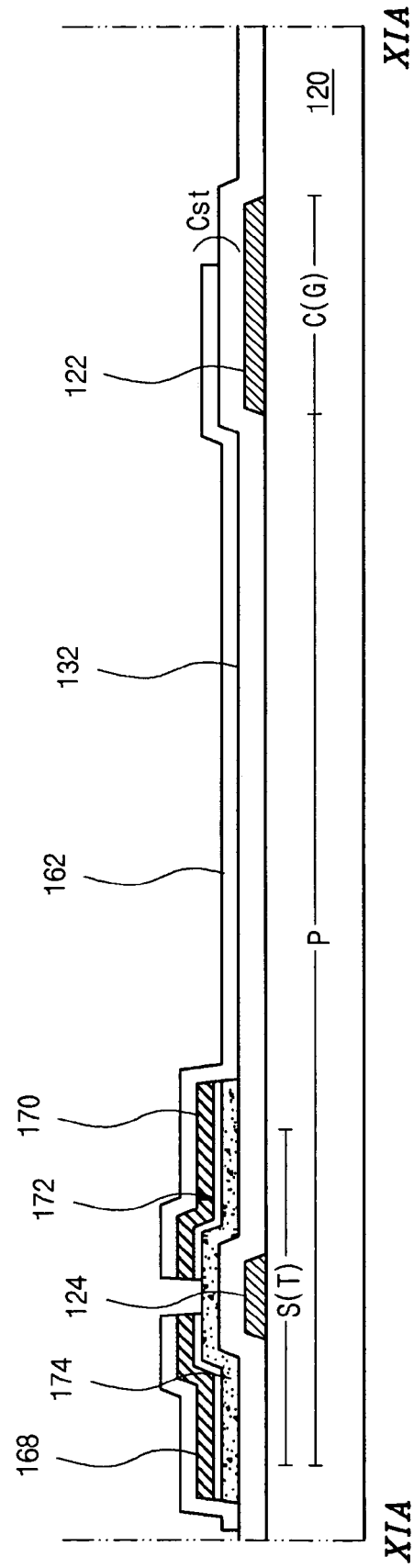
FIGS. 21A to 21C illustrate part of a third mask process of a fabricating method of an array substrate for an LCD device according to the present invention.
Figure 21B:
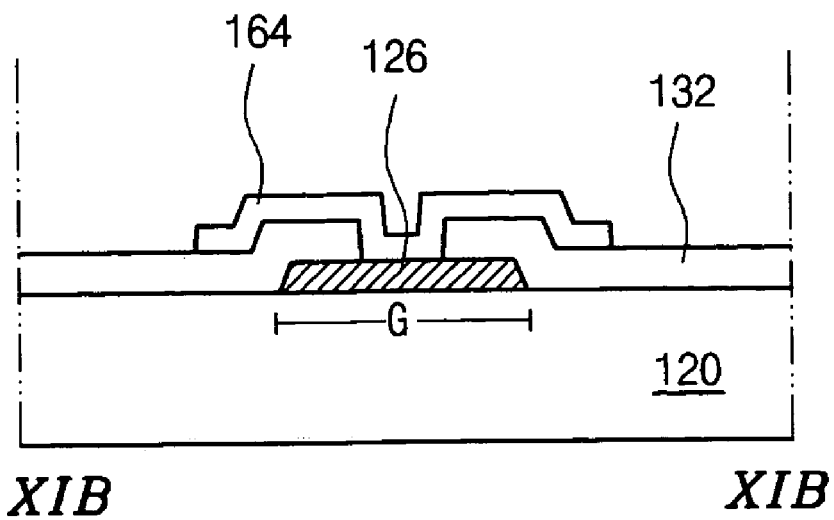
Figure 21C:
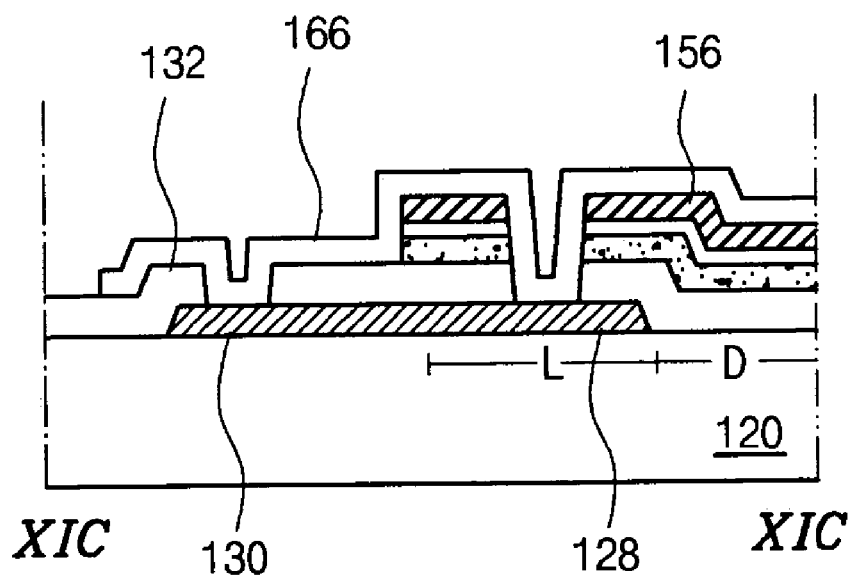

Accordingly, as shown in FIGS. 21A, 21B and 21C, a thin film transistor T is formed in a switching region S(T), the pixel electrode 162 is formed in the pixel region P, a storage capacitor Cst is formed in the storage region C. The thin film transistor T includes the gate electrode 124, the active layer 174, the ohmic contact layer 172, the source electrode 168 and the drain electrode 170. The pixel electrode 162 overlaps the drain electrode 170. The storage capacitor Cst includes a part of the gate line 124 as a first electrode and a part of the pixel electrode 162 overlapping the part of the gate line 124 as a second electrode. At one end of the gate line 122, the gate pad terminal 164 covers and contacts the gate pad 126, and at one end of the data line 156, the data pad terminal 166 electrically connects the data pad 122 and the data line 156.

In the present invention, a passivation layer is not required to be formed on the source and drain electrodes 168 and 170, and thus the manufacturing costs are even further reduced.

Furthermore, an oxide film (not shown) may be further formed on a surface of the active layer exposed between the source and drain electrodes. The oxide film may be formed by an oxygen plasma treatment method. The oxide film protects the active layer.

Thus, the array substrate may be fabricated through three mask processes. Thus, manufacturing time and costs may be reduced due to simplified processes. Productivity is also improved. Problems due to complicated processes may be significantly reduced. Additionally, damages to the metal lines may be prevented by equalizing the thickness of the photoresist pattern during the second mask process. Thus, a high quality LCD device without signal problems is fabricated.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of an array substrate for a liquid crystal display device, comprising:
   forming a gate line, a gate pad, a gate electrode, and a data pad on a substrate through a first mask process;
   forming a gate insulating layer on a substantial part of an entire surface of the substrate including the gate line, the gate pad, the gate electrode, and the data pad;
   forming a data line, a source-drain pattern and an active layer on the gate insulating layer and forming a gate pad contact hole and a data pad contact hole in the gate insulating layer through a second mask process using a mask including a blocking portion, a transmitting portion, and a half transmitting portion, wherein the half transmitting portion includes a first half transmitting portion and a second half transmitting portion, the first half transmitting portion having wider slits than the second half transmitting portion, the second half transmitting portion corresponding to the gate line, the gate pad and the data pad; and
   forming a pixel electrode, a gate pad terminal, a data pad terminal, a source electrode, a drain electrode, and an ohmic contact layer through a third mask process.

2. The method according to claim 1, wherein the second mask process includes:
   sequentially forming an intrinsic amorphous silicon layer, an impurity-doped amorphous silicon layer and a metal layer on the gate insulating layer;
   forming a photoresist layer on the metal layer;
   disposing the mask over the photoresist layer;
   forming a first photoresist pattern by exposing the photoresist layer to light through the mask and then developing the photoresist layer, the first photoresist pattern selectively exposing the metal layer and having a first part and a second part thinner than the first part, wherein either the transmitting portion or the blocking portion of the mask corresponds to the first part and the half transmitting portion corresponds to the second part;
   selectively removing the metal layer, the impurity-doped amorphous silicon layer, the intrinsic amorphous silicon layer and the gate insulating layer using the first and second parts of the first photoresist pattern as an etching mask to thereby form the gate pad contact hole and the data pad contact hole;
   removing the second part of the first photoresist pattern;
   selectively removing the metal layer, the impurity-doped amorphous silicon layer and the intrinsic amorphous silicon layer using the first part of the first photoresist pattern as an etching mask to thereby form the data line, the source-drain pattern, an impurity-doped amorphous silicon pattern, and the active layer; and
   removing the first part of the first photoresist pattern.

3. The method according to claim 2, wherein the third mask process includes:
   forming a transparent conductive layer on a substantial part of an entire surface of the substrate including the data line and the source-drain pattern;
   forming a second photoresist pattern on the transparent conductive layer;
   selectively removing the transparent conductive layer using the second photoresist pattern as an etching mask to thereby form the pixel electrode, the gate pad terminal and the data pad terminal;
   selectively removing the source-drain pattern and the impurity-doped amorphous silicon pattern to thereby form the source electrode, the drain electrode and the ohmic contact layer; and
   removing the second photoresist pattern.

4. The method according to claim 1, wherein the slits of the first and second half transmitting portions have a width within a range of 0.5 µm to about 2.5 µm.

5. The method according to claim 4, wherein the first half transmitting portion includes narrower patterns between the slits than the second half transmitting portion, the patterns of the first and second half transmitting portions have a width within a range of about 0.5 µm to about 2.5 µm.

6. The method according to claim 5, wherein the slits of the first half transmitting portion have a width of about 1.3 µm and the slits of the second half transmitting portion have a width of about 1.2 µm.

7. The method according to claim 6, wherein the patterns of the first half transmitting portion have a width of about 1.4 µm and the patterns of the second half transmitting portion have a width of about 1.5 µm.

8. The method according to claim 1, wherein the pixel electrode covers and contacts the drain electrode.

9. The method according to claim 1, wherein the data pad terminal covers and contacts the data pad and one end of the data line.

10. The method according to claim 1, wherein the first mask process further includes forming a link portion extending from the data pad, and the second mask process further includes forming a link hole exposing the link portion, wherein the link portion overlaps the data line, and the data pad terminal contacts the data line, the data pad and the link portion.

11. The method according to claim 1, wherein the third mask process further includes forming a transparent conductive pattern extending from the data pad terminal, wherein the transparent conductive pattern covers and contacts the data line and the source electrode.

12. The method according to claim 1, further including forming an oxide film on an exposed surface of the active layer.

13. The method according to claim 12, wherein the oxide film is formed through an oxygen plasma treatment method.

14. The method according to claim 1, wherein the pixel electrode overlaps a part of the gate line to thereby form a storage capacitor.

15. The method according to claim 1, wherein the pixel electrode, the gate pad terminal and the data pad terminal are formed of a material selected from a transparent conductive material group including indium tin oxide and indium zinc oxide.

16. The method according to claim 1, wherein forming the data line includes forming an impurity-doped amorphous silicon pattern and an intrinsic amorphous silicon pattern having a same shape as the data line.

* * * * *